(12) United States Patent
Zhang et al.

(10) Patent No.: US 10,224,339 B2
(45) Date of Patent: Mar. 5, 2019

(54) SEMICONDUCTOR MEMORY DEVICES

(71) Applicants: Gang Zhang, Suwon-si (KR); Hyuk Kim, Seongnam-si (KR); Yong-Hyun Kwon, Hwaseong-si (KR); Sangwuk Park, Hwaseong-si (KR)

(72) Inventors: Gang Zhang, Suwon-si (KR); Hyuk Kim, Seongnam-si (KR); Yong-Hyun Kwon, Hwaseong-si (KR); Sangwuk Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 3 days.

(21) Appl. No.: 15/822,586

(22) Filed: Nov. 27, 2017

(65) Prior Publication Data

US 2018/0090509 A1    Mar. 29, 2018

Related U.S. Application Data

(63) Continuation of application No. 15/403,829, filed on Jan. 11, 2017, now Pat. No. 9,831,260.

(30) Foreign Application Priority Data

Mar. 2, 2016    (KR) .................. 10-2016-0025228

(51) Int. Cl.
| | |
|---|---|
| *H01L 27/11573* | (2017.01) |
| *H01L 27/11582* | (2017.01) |
| *H01L 27/092* | (2006.01) |
| *H01L 23/522* | (2006.01) |
| *H01L 27/11575* | (2017.01) |
| *H01L 27/12* | (2006.01) |

(Continued)

(52) U.S. Cl.
CPC .... *H01L 27/11573* (2013.01); *H01L 23/5226* (2013.01); *H01L 27/0925* (2013.01); *H01L 27/1157* (2013.01); *H01L 27/11575* (2013.01); *H01L 27/11582* (2013.01); *H01L 27/1207* (2013.01); *H01L 2027/11861* (2013.01); *H01L 2924/1438* (2013.01)

(58) Field of Classification Search
CPC ................................................ H01L 27/0925
USPC ............... 257/314, 318; 365/185.01, 185.15
See application file for complete search history.

(56) References Cited

U.S. PATENT DOCUMENTS

| | | |
|---|---|---|
| 5,534,456 A | 7/1996 | Yuan et al. |
| 5,747,359 A | 5/1998 | Yuan et al. |

(Continued)

FOREIGN PATENT DOCUMENTS

| | | |
|---|---|---|
| JP | 2003-502831 A | 1/2003 |
| JP | 4381908 B2 | 10/2009 |

(Continued)

*Primary Examiner* — David Vu
*Assistant Examiner* — Brandon Fox
(74) *Attorney, Agent, or Firm* — Myers Bigel, P.A.

(57) ABSTRACT

Provided is a semiconductor memory device. The semiconductor memory device includes a peripheral circuit gate pattern on a first substrate, an impurity region in the first substrate and spaced apart from the peripheral circuit gate pattern, a cell array structure on the peripheral circuit gate pattern, a second substrate between the peripheral circuit gate pattern and the cell array structure, and a via that is in contact with the impurity region and disposed between the first substrate and the second substrate. The via electrically connects the first and second substrates to each other.

12 Claims, 40 Drawing Sheets

(51) Int. Cl.
*H01L 27/1157* (2017.01)
*H01L 27/118* (2006.01)

(56) References Cited

U.S. PATENT DOCUMENTS

| | | | |
|---|---|---|---|
| 6,143,129 | A | 11/2000 | Savas et al. |
| 6,406,925 | B1 | 6/2002 | Athavale et al. |
| 7,501,161 | B2 | 3/2009 | Hou et al. |
| 9,490,263 | B2 * | 11/2016 | Jeon .................. H01L 27/11807 |
| 9,831,260 | B2 * | 11/2017 | Zhang ............... H01L 27/11573 |
| 2015/0372000 | A1 * | 12/2015 | Jee .................... H01L 27/11573 257/314 |
| 2016/0064407 | A1 * | 3/2016 | Kim .................. H01L 27/11556 257/324 |

FOREIGN PATENT DOCUMENTS

| KR | 10-2001-0064058 A | 7/2001 |
|---|---|---|
| KR | 10-2005-0069171 A | 7/2005 |

* cited by examiner

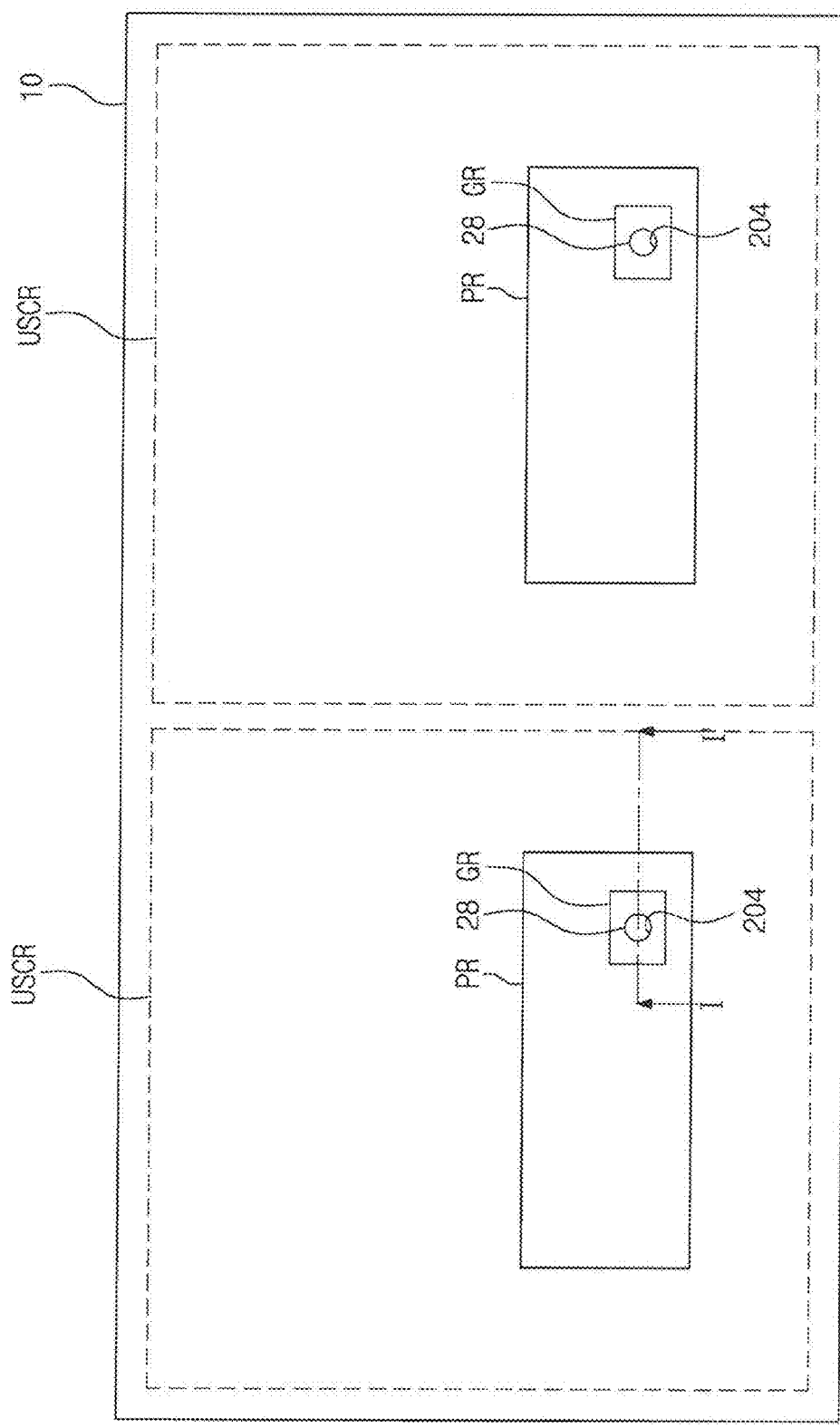

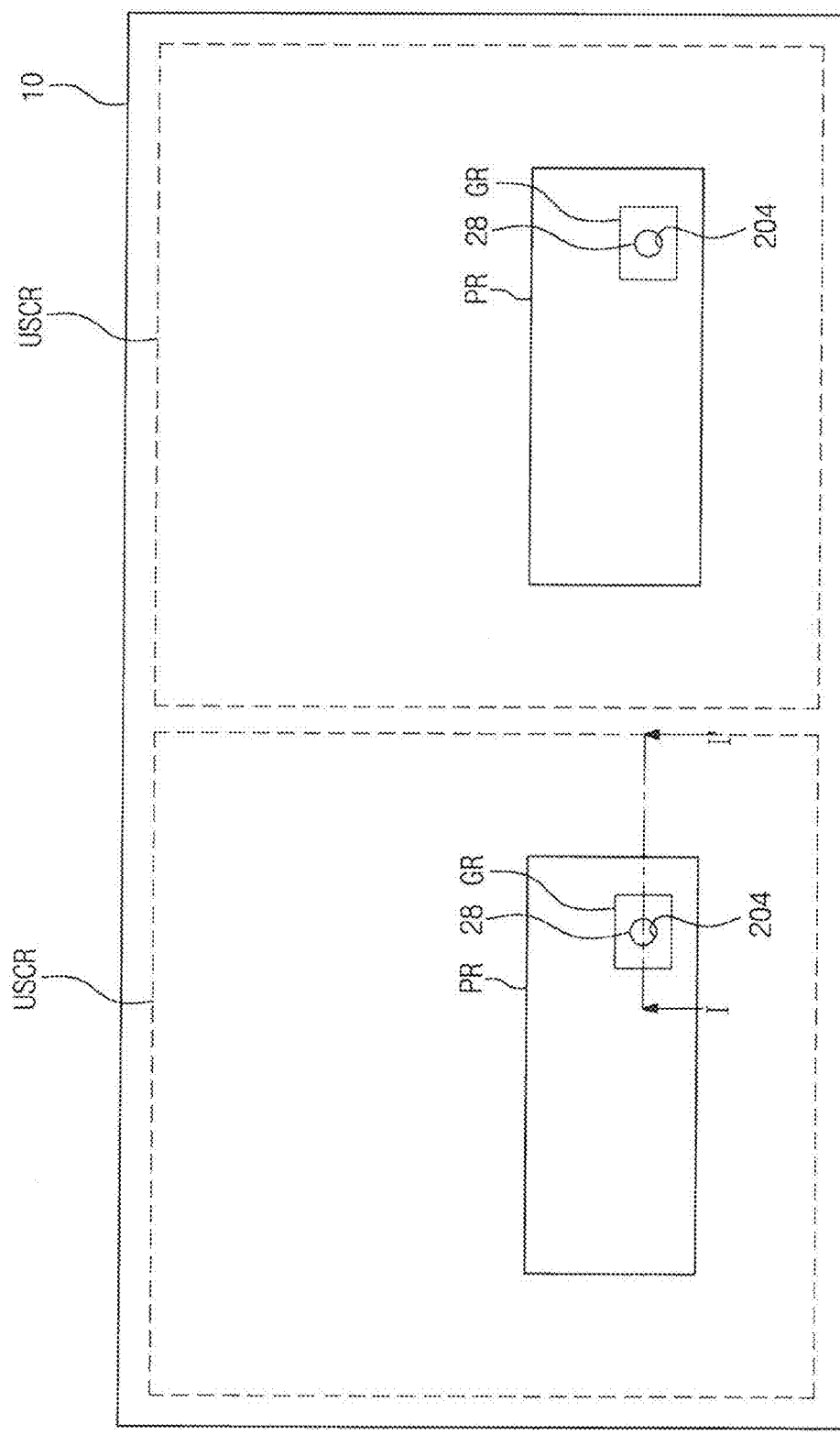

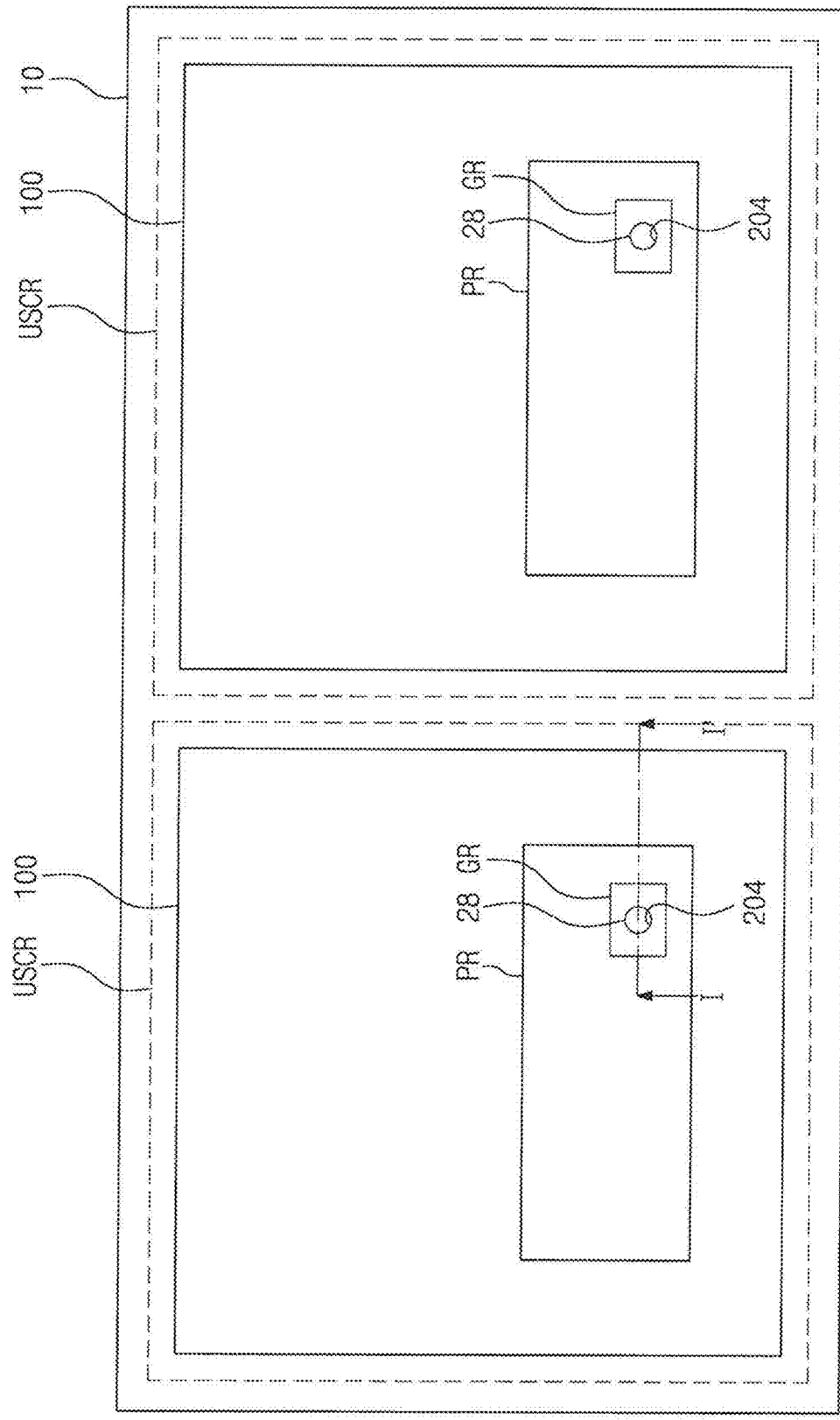

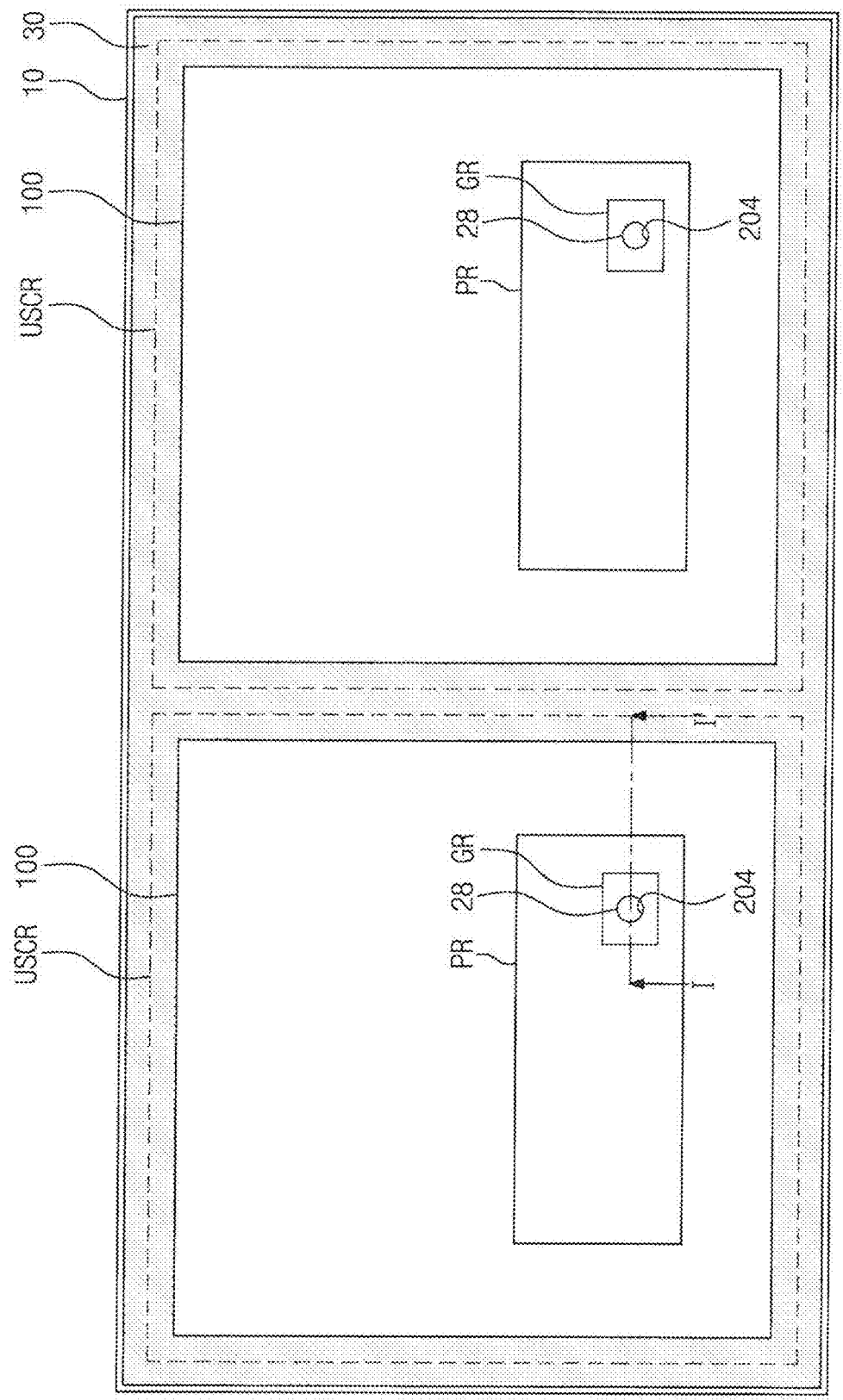

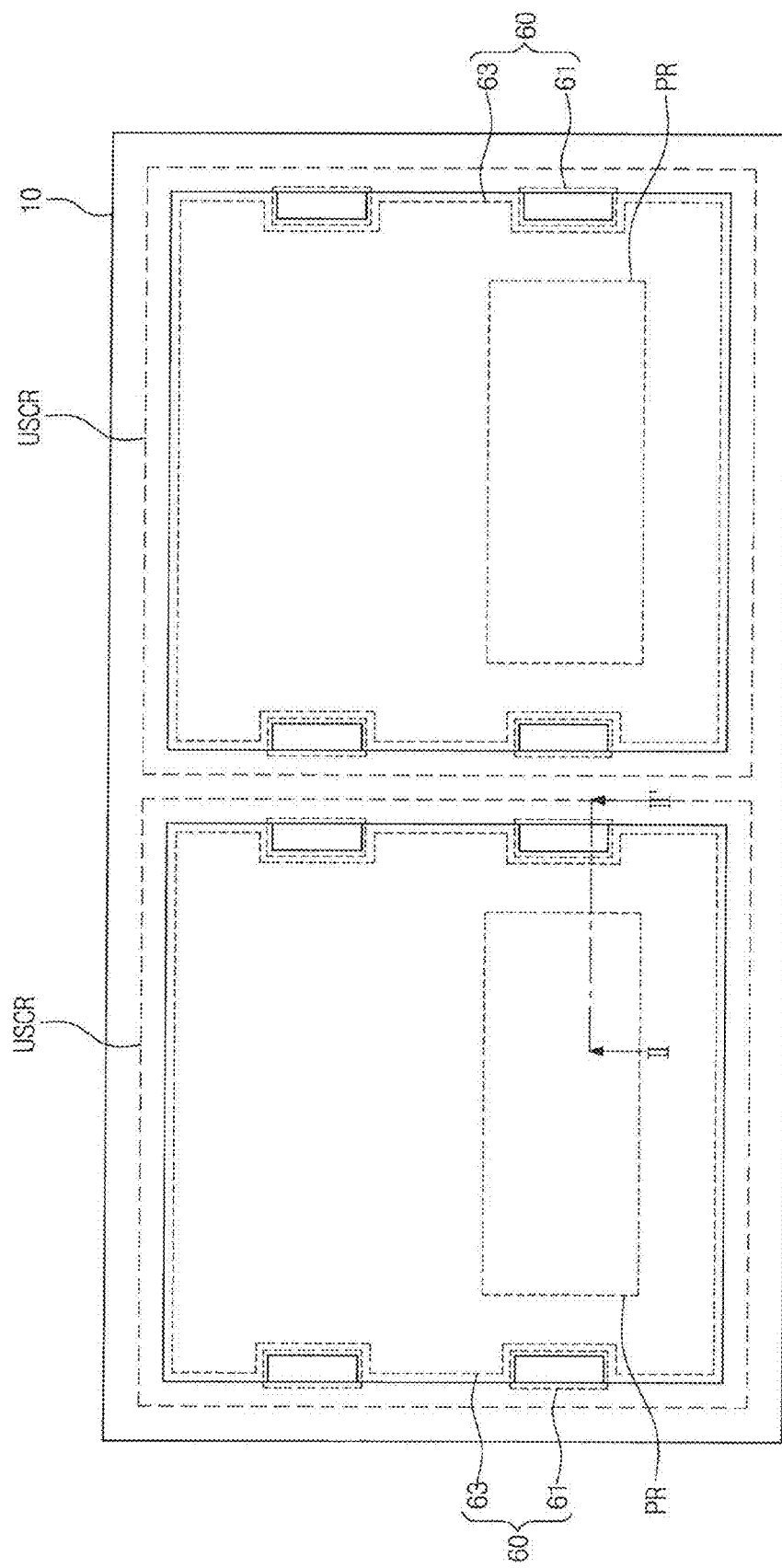

SEMICONDUCTOR MEMORY DEVICES

CROSS-REFERENCE TO RELATED APPLICATIONS

This application is a continuation of U.S. patent application Ser. No. 15/403,829, filed Jan. 11, 2017, which itself claims the benefit of priority under 35 U.S.C. § 119 of Korean Patent Application 10-2016-0025228 filed on Mar. 2, 2016, the entire contents of which are hereby incorporated by reference.

BACKGROUND

The present inventive concept relates to semiconductor devices and, more particularly, to three-dimensional semiconductor devices.

Semiconductor memory devices have been highly integrated for satisfying high performance and low manufacture costs, which may be required by users. Because integration of the semiconductor memory devices may be an important factor in determining product price, highly integrated semiconductor memory devices are increasingly in demand. Integration of typical two-dimensional or planar semiconductor memory devices is primarily determined by the area occupied by a unit memory cell, such that it may be greatly influenced by the level of technology for forming fin patterns. However, the extremely expensive processing equipment used to increase, pattern fineness may set a practical limitation on increasing the integration of two-dimensional or planar semiconductor devices.

To overcome the above limitations, three-dimensional semiconductor memory devices having three-dimensionally arranged memory cells have been proposed. However, to mass produce three-dimensional semiconductor memory devices, new process technologies may be developed in such a manner that can provide a lower manufacturing cost per bit than two-dimensional semiconductor devices while maintaining or exceeding their level of reliability.

SUMMARY

Embodiments of the present inventive concept may provide a semiconductor memory device having improved reliability.

According to exemplary embodiments of the present inventive concept, a semiconductor memory device may comprise: a peripheral circuit gate pattern on a first substrate; an impurity region in the first substrate and spaced apart from the peripheral circuit gate pattern; a cell array structure on the peripheral circuit gate pattern; a second substrate between the peripheral circuit gate pattern and the cell array structure; and a via that is in contact with the impurity region and disposed between the first substrate and the second substrate. The via may electrically connect the first and second substrates to each other.

According to exemplary embodiments of the present inventive concept, a semiconductor memory device may comprise: a substrate including a peripheral circuit region and a ground region spaced apart from the peripheral circuit region, the ground region corresponding to a portion of an edge of the substrate; an impurity region in the ground region of the substrate; an interlayer dielectric layer on the substrate and exposing the impurity region; a silicon structure including a first portion in the interlayer dielectric layer and in contact with the impurity region and a second portion extending front the first portion onto a top surface of the interlayer dielectric layer, the silicon structure being electrically connected to the substrate; and a cell array structure on the second portion of the silicon structure.

According to exemplary embodiments of the present inventive concept, a semiconductor memory device may comprise a first substrate; an impurity region in the first substrate; an interlayer dielectric layer on the first substrate; a second substrate on the interlayer dielectric layer; a cell array region on the second substrate that overlaps the impurity region; and a via that penetrates the interlayer dielectric layer so as to electrically connect the second substrate to the first substrate.

It is noted that aspects of the inventive concept described with respect to one embodiment, may be incorporated in a different embodiment although not specifically described relative thereto. That is, all embodiments and/or features of any embodiment can be combined in any way and/or combination. These and other aspects of the inventive concept are explained in detail in the specification set forth below.

BRIEF DESCRIPTION OF THE DRAWINGS

FIGS. 10A to 15A are plan views illustrating a method for fabricating a semiconductor memory device according to exemplary embodiments of the present inventive concept;

FIGS. 10B to 15B and 16 to 20 show a method for fabricating a semiconductor memory device according to exemplary embodiments of the present inventive concept, wherein FIGS. 10B to 15B are cross-sectional views taken along line I-I' of FIGS. 10A to 15A, respectively, and FIGS. 16 to 20 are cross-sectional views illustrating subsequent processes after those illustrated in FIG. 15A;

FIGS. 21A to 27A are plan views illustrating a method for fabricating a semiconductor memory device according to exemplary embodiments of the present inventive concept; and FIGS. 21B to 27B are cross-sectional views, taken along line II-II' of FIGS. 21A to 27A, respectively, illustrating a method for fabricating a semiconductor memory device according to exemplary embodiments of the present inventive concept.

DETAILED DESCRIPTION OF EMBODIMENTS

Figure 1:
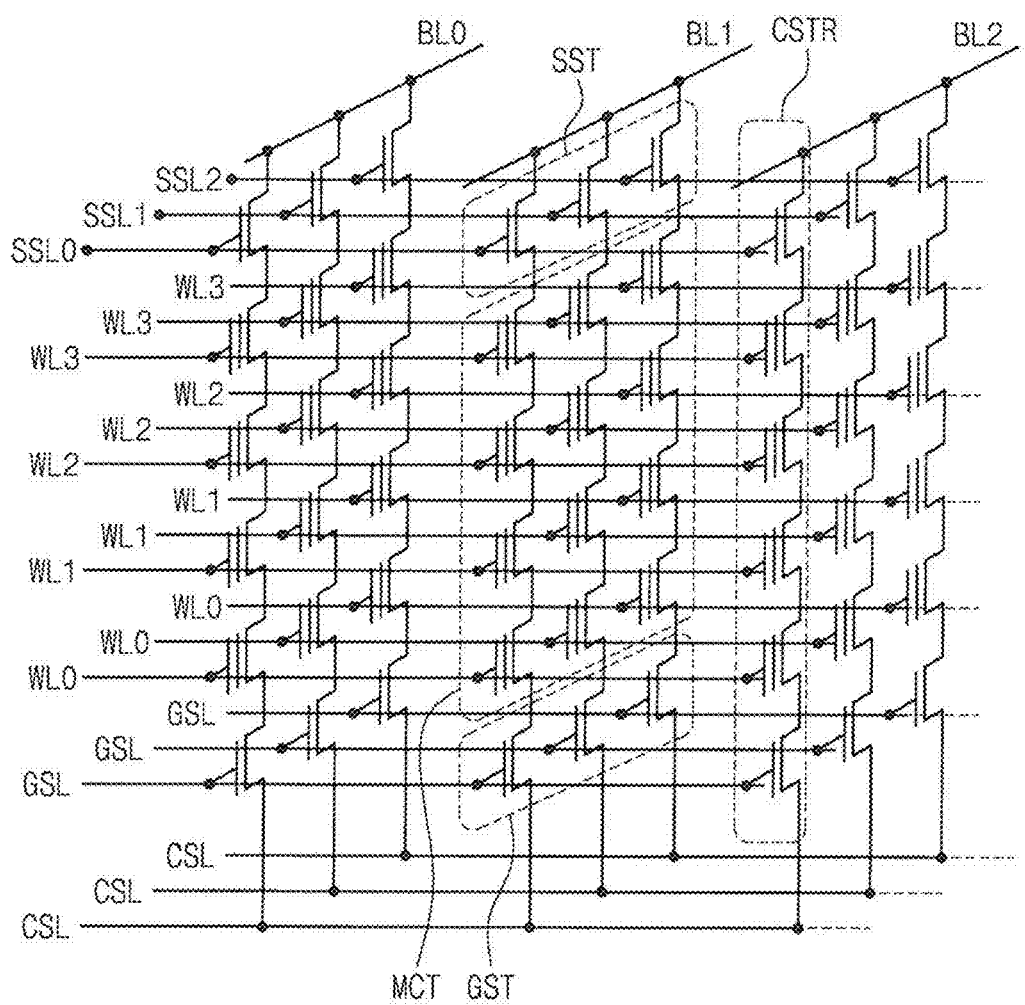
FIG. 1 is a circuit: diagram illustrating a semiconductor device according to exemplary embodiments of the present inventive concept.

FIG. 1 is a circuit diagram illustrating a semiconductor device according to exemplary embodiments of the present inventive concept.

Referring to FIG. 1, a semiconductor device may include a common source line CSL, plurality of bit lines BL0, BL1 and BL2, and a plurality of cell strings CSTR between the common source line CSL and the bit lines BL0 to BL2.

The common source line CSL may be a conductive layer provided on a semiconductor substrate or an impurity region disposed in the semiconductor substrate. The bit lines BL0 to BL2 may be conductive patterns (e.g., metal lines) disposed on and spaced apart from the semiconductor substrate. The bit lines BL0 to BL2 may be two-dimensionally arranged, and each of the bit lines BL0 to BL2 may be connected in parallel to a plurality of cell strings CSTR. Accordingly, the cell strings CSTR may be two-dimensionally arranged on the common source line CSL or the semiconductor substrate.

Each of the cell strings CSTR may include a ground selection transistor GST, a string selection transistor SST connected to one of the bit lines BL0 to BL2, and a plurality of memory cell transistors MCT between the ground selection transistor GST and the string selection transistor SST. The ground selection transistor GST, the plurality of memory cell transistors MCT, and the string selection transistor SST may be connected in series. A ground selection line GSL, a plurality of word lines WL0, WL1, WL2 and WL3, and a plurality of string selection lines SSL0, SSL1 and SSL2 may respectively serve as a gate electrode of the ground selection transistor GST, gate electrodes of the memory cell transistors MCT, and a gate electrode of the string selection transistor SST.

The ground selection transistors GST may be spaced apart from the semiconductor substrate at substantially the same distance, and the gate electrodes thereof may be commonly connected to the ground selection line GSL so as to have the same potential. The ground selection line GSL may be disposed between the common source line CSL and its most adjacent memory cell transistor MCT. Similarly, the gates electrodes of the memory cell transistors MCT, which are spaced apart from the common source line CSL at substantially the same distance, may also be commonly connected to one of the word lines WL0 to WL3 so as to have the same potential. A single cell string CSTR may include a plurality of memory cell transistors MCT, which are spaced, apart from the common source line CSL at different distances, and, thus, a plurality of word lines WL0 to WL3 may be disposed between the common source line CSL and each of the bit lines BL0 to BL2.

The ground selection transistor GST, the string selection transistor SST, and the memory cell transistors MCT may be MOSFETs, which use channel structures as channel regions. In some embodiments, the channel structure may constitute a MOS capacitor together with the ground selection line GSL, the word lines WL0 to WL3, and the string selection line SSL. In this case, the ground selection transistor GST, the memory cell transistors MCT, and the string selection transistor SST may be electrically connected to each other by sharing inversion layers formed by a fringe field generated from the ground selection line GSL, the word lines WL0 to WL3, and the string selection lines SSL.

Figure 2:
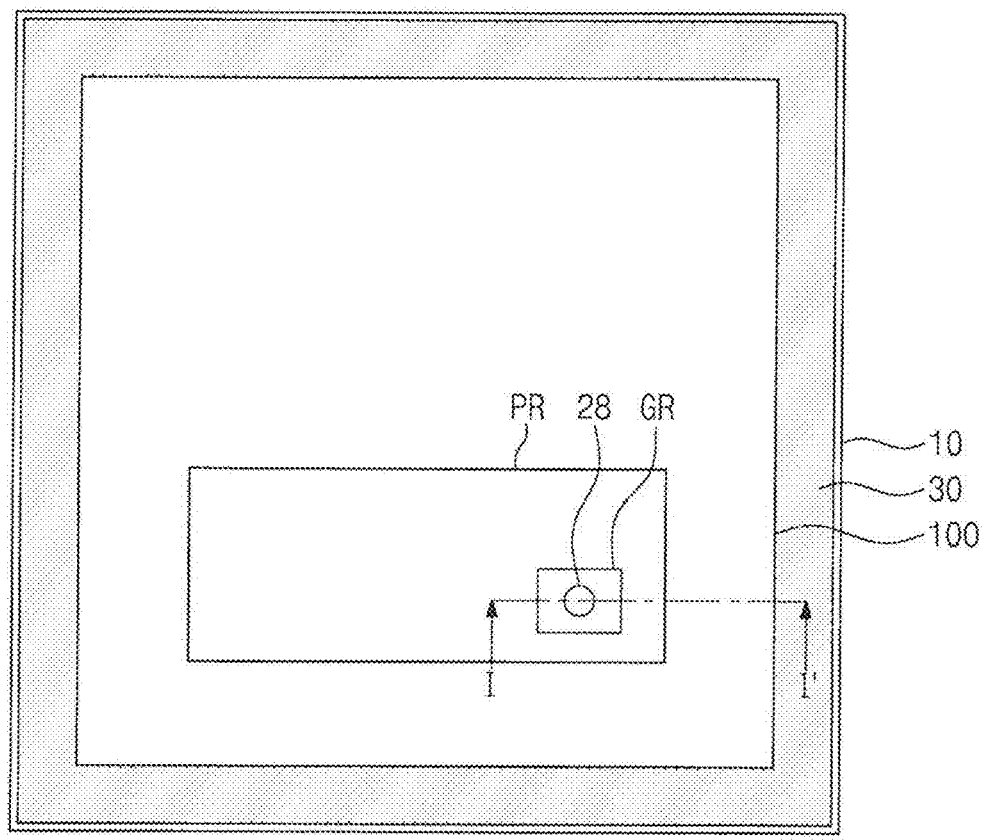
FIG. 2 is a plan view illustrating a unit semiconductor chip including a semiconductor memory device according to exemplary embodiments of the present inventive concept.
Figure 3:
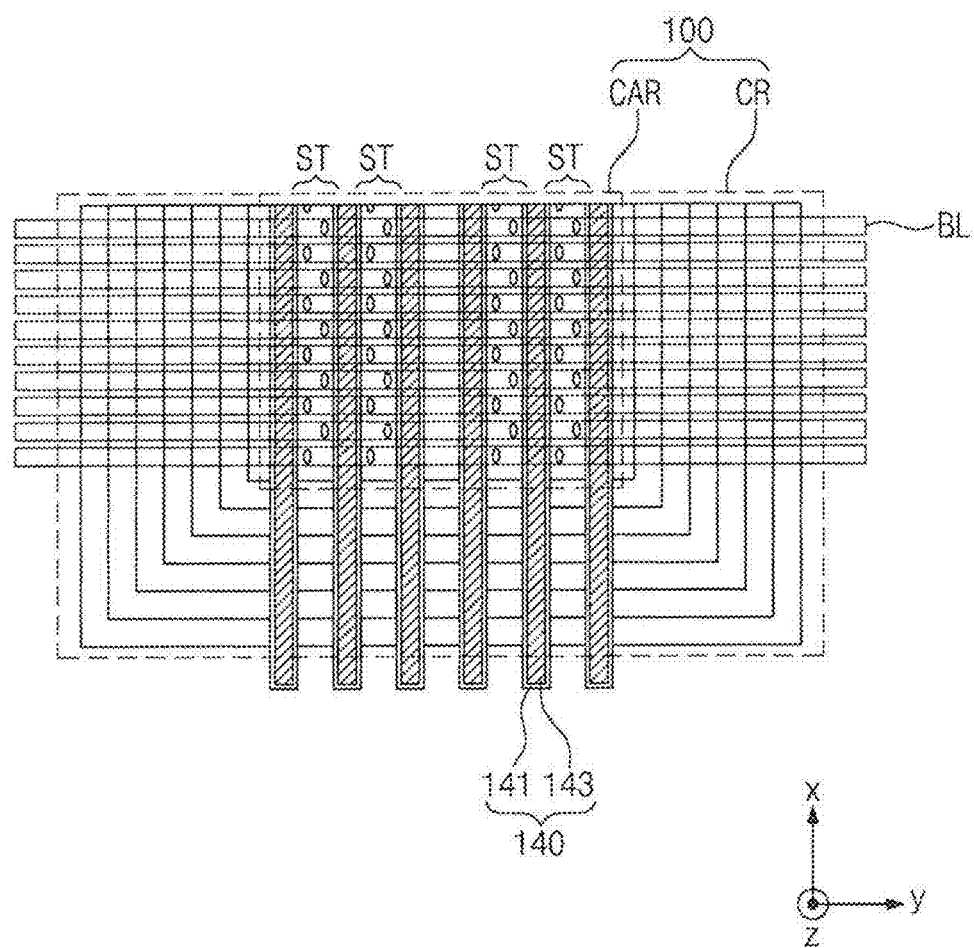
FIG. 3 is a plan view illustrating a cell memory structure of a semiconductor memory device at a portion of a unit semiconductor chip according to exemplary embodiments of the present inventive concept.
Figure 4:
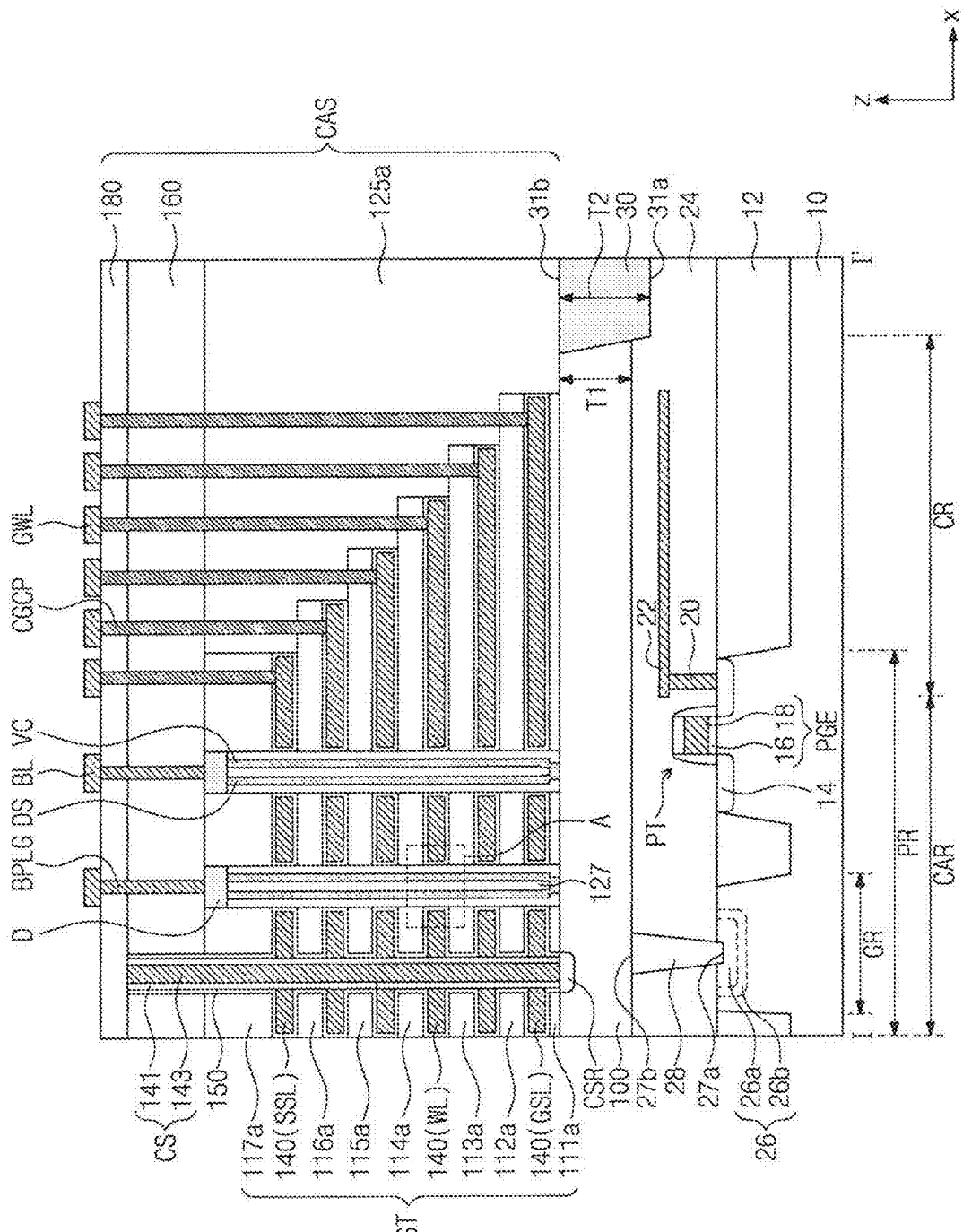
FIG. 4 is a cross-sectional view, taken along line I-I' of FIG. 2, illustrating a semiconductor memory device according to exemplary embodiments of the present inventive concept.
Figure 5:
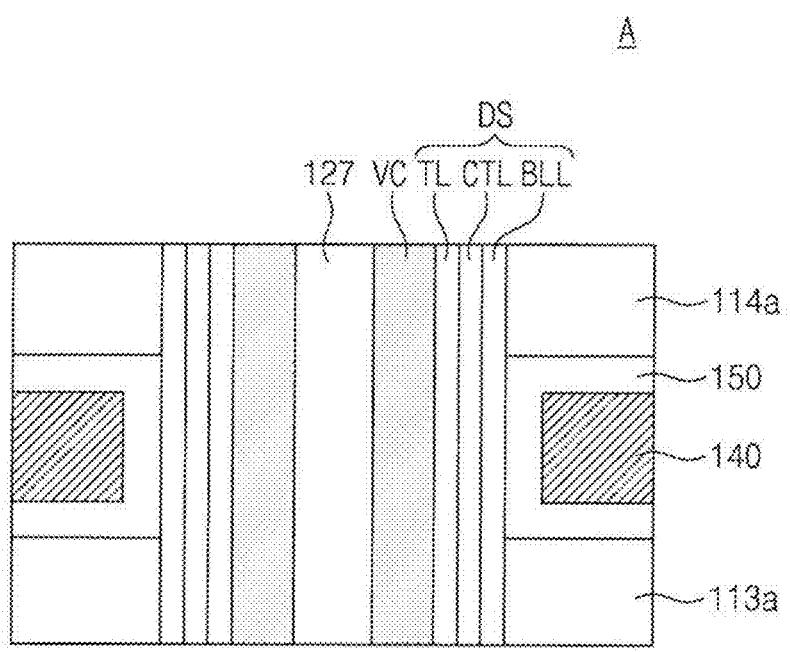
FIG. 5 is an enlarged cross-sectional view illustrating a section A of FIG. 4.

FIG. 2 is a plan view illustrating a unit semiconductor chip including a semiconductor memory device according to exemplary embodiments of the present inventive concept. FIG. 3 is a plan view illustrating a cell memory structure of a semiconductor memory device at a portion of a unit semiconductor chip according to exemplary embodiments of the present inventive concept. FIG. 4 is a cross-sectional view, taken along line I-I' of FIG. 2, illustrating a semiconductor memory device according to exemplary embodiments of the present inventive concept. FIG. 5 is an enlarged cross-sectional view illustrating a section A of FIG. 4.

Referring to FIGS. 2 to 4, a unit semiconductor chip including a semiconductor memory device may include a first substrate 10, a peripheral transistor PT disposed on the first substrate 10, a second substrate 100 that is disposed on the peripheral transistor PT and vertically overlaps the first substrate 10, and a cell array structure CAS disposed on the second substrate 100.

A device isolation layer 12 may be disposed in the first substrate 10. The device isolation layer 12 may define active sections of the first substrate 10. The active sections of the first substrate 10 may include a ground region OR and a peripheral circuit region PR on which peripheral transistors are disposed. For example, the ground region GR may be disposed in the peripheral circuit region PR. The ground region GR may be a portion of the peripheral circuit region PR. Although not shown in figures, the ground region GR may be provided in plural and the plurality of ground regions GR may be disposed in the peripheral circuit region PR of the first substrate 10.

The first substrate 10 may be, for example, a single crystalline silicon substrate, a silicon-germanium substrate, a germanium substrate, or a single crystalline epitaxial layer grown on a single crystalline silicon substrate. For example, the first substrate 10 may have a first conductivity (e.g., p-type).

The peripheral transistor PT may be disposed in the peripheral circuit region PR of the first substrate 10. The peripheral transistor PT may include a peripheral circuit gate electrode PGE on the first substrate 10 and source/drain regions 14 on opposing sides of the peripheral circuit gate electrode PGE in the first substrate 10. The peripheral circuit gate electrode PGE may include a gate conductive pattern 18 and a gate dielectric pattern 16 between the gate conductive pattern 18 and the first substrate 10. The peripheral transistor PT may be electrically connected to and configured to control at least one of the bit lines BL, the word lines WL0 to WL3, the common source lines CSL, the ground selection lines GSL, and the string selection lines SSL.

A contact plug 20 and a conductive line 22 may be disposed on the first substrate 10. The contact plug 20 may be in contact with one of the source/drain regions 14, and the conductive line 22 may be connected to the contact plug 20. Although not shown in figures, the contact plug 20 may be provided in plural and the plurality of contact plugs 20 may be respectively disposed on the source/drain regions 14.

An impurity region 26 may be disposed in the ground region GR of the first substrate 10. The impurity region 26 may be disposed spaced apart from the peripheral transistor PT. The impurity region 26 may have a second conductivity (e.g., n-type) different from that of the first substrate 10. The impurity region 26 may include a first impurity region 26a and a second impurity region 26b enveloping the first impurity region 26a. For example, the first impurity region 26a may have an impurity concentration greater than that of the second impurity region 26b.

A first interlayer dielectric layer 24 may be disposed on the first substrate 10. The first interlayer dielectric layer 24 may cover the peripheral transistor PT, the contact plug 20, and the conductive line 22. The first interlayer dielectric layer 24 may include, for example, a silicon oxide layer, a silicon nitride layer, or a silicon oxynitride layer.

The second substrate 100 may be disposed on the first interlayer dielectric layer 24. The second substrate 100 may include a cell array region CAR and a contact region CR disposed around the cell array region CAR. For example, the entirety or the peripheral circuit region PR of the first substrate 10 may partially overlap the cell array region CAR of the second substrate 100. The second substrate 100 may include a single crystalline or polycrystalline semiconductor layer. For example, the second substrate 100 may include a polysilicon layer.

A via 28 may be disposed in the first interlayer dielectric layer 24 and be in contact with the impurity region 26. For example, the via 28 may be disposed between the peripheral circuit region PR of the first substrate 10 and the cell array region CAR of the second substrate 100. The via 28 may electrically connect the first and second substrate 10 and 100 to each other. The via 28 may have a bottom surface 27a in contact with the impurity region 26 and a top surface 27b coplanar with a bottom surface of the second substrate 100. The top surface 27b of the via 28 may be higher than a top surface of the contact plug 20. The via 28 may include, for example, a polysilicon layer.

In an embodiment, the second substrate 100 may be applied with a high voltage when an erase operation is performed on memory cells included in the cell array structure CAS. To reduce or prevent current flow from the second substrate 100 to the first substrate 10 through the via 28, the impurity region 26 may be formed to have conductivity different from that of the first substrate 10.

An isolation pattern 30 may be disposed to wrap a side surface of the second substrate 100. The isolation pattern 30 may have a top surface 31b coplanar with a top surface of the second substrate 100. The isolation pattern 30 may also have a bottom surface 31a lower than a bottom surface of the second substrate 100. In other words, the bottom surface 31a of the isolation pattern 30 may be disposed within the first interlayer dielectric layer 24. For example, the second substrate 100 may, have a thickness T1 less than a thickness T2 of the isolation pattern 30. Alternatively, the thickness T1 of the second substrate 100 may be substantially the same as the thickness T2 of the isolation pattern 30. As shown in FIG. 2, a sum of planar areas of the second substrate 100 and the isolation pattern 30 may be substantially the same as a planar area of the first substrate 10. The isolation pattern 30 may include, for example, a silicon oxide layer, a silicon nitride layer, or a silicon oxynitride layer.

The cell array structure CAS may be disposed on the second substrate 100. The cell array structure CAS may include a plurality of stack structures ST. The stack structures ST may be disposed on the second substrate 100 of the cell array region CAR and the contact region CR. The stack structures ST may be arranged spaced apart from each other in a second direction Y on the second substrate 100. The stack structure ST may extend in a first direction X crossing the second direction Y.

A cell impurity region CSR may be disposed in the second substrate 100 between the stack structures ST. The cell impurity region CSR may extend in the first direction X. The cell impurity region CSR may correspond to the common source line CSL of FIG. 1. The cell impurity region CSR may have a conductivity (e.g., n-type) different from that of the second substrate 100.

Each of the stack structures ST may include insulation patterns 111a to 117a and gate electrodes 140. The insulation patterns 111a-117a and the gate electrodes 140 may be stacked alternately and repeatedly in a third direction Z perpendicular to the top surface of the second substrate 100.

The gate electrodes 140 may extend in the first direction X. The gate electrodes 140 may have different lengths in the first direction X. For example, the lengths of the gate electrodes 140 may be gradually decreased with increasing distance from the second substrate 100. The gate electrodes 140 may include end portions that are stacked in a stair-shaped profile on the contact region CR of the second substrate 100. Accordingly, the end portions of the gate electrodes 140 may be exposed on the contact region CR of the second substrate 100.

The gate electrodes 140 may include a ground selection gate electrode GSL, cell gate electrodes WL, and a string selection gate electrode SSL. Specifically, the ground selection gate electrode GSL may correspond to a lowermost one of the gate electrodes 140. The string, selection gate electrode SSL may correspond to an uppermost one of the gate electrodes 140. And the cell gate electrodes WL may correspond to intervening gate electrodes between the lowermost gate electrode and the uppermost gate electrode. The gate electrodes 140 may include at least one of doped silicon, a metal (e.g., tungsten, copper, aluminum, etc.), conductive metal nitride (e.g., titanium nitride, tantalum nitride, etc.), a transitional metal (e.g., titanium, tantalum, etc.).

The insulation patterns 111a to 117a may be respectively disposed between the gate electrodes 140. The insulation patterns 111a to 117a may extend in the first direction X. The insulation patterns 111a to 117a may have different lengths in the first direction X. For example, the lengths of the insulation patterns 111a to 117a may become shorter with increasing distance from the second substrate 100. Each of the insulation patterns 111a to 117a may have a length substantially identical to that of its underlying gate electrode 140. Accordingly, the insulation patterns 111a to 117a may cover tap surfaces of the exposed, end portions of the gate electrodes 140 on the contact region CR of the second substrate 100.

An interlayer dielectric pattern 125a may be disposed on the second substrate 100 and the isolation pattern 30. The interlayer dielectric pattern 125a may cover end portions of the insulation patterns 111a to 117a on the contact region CR of the second, substrate 100, a top surface of the second substrate 100 exposed through the stack structures ST, and a top surface of the isolation pattern 30. The interlayer dielectric pattern 125a may include a silicon oxide layer.

A plurality of vertical channel regions VC may be disposed to penetrate the stack structure ST in the third direction Z. Specifically, the vertical channel regions VC may penetrate the insulation patterns 111a to 117a and the gate electrodes 140, and, thus, be electrically connected to the second substrate 100. As viewed in plan, the vertical channel regions VC may be zigzag or linearly arranged in the second direction Y. The vertical channel regions VC may include a hollow pipe shape, a cylindrical shape, or a cup shape. The vertical channel regions VC may be formed of a single layer or a multiple layer. The vertical channel regions VC may include one of a polycrystalline silicon layer, an organic semiconductor layer, or a carbon nanostructure.

A charge storage structure DS may be disposed between the stack structure ST and each of the vertical channel regions VC. Specifically, the charge storage structure DS may be disposed between the vertical channel region VC and each of the gate electrodes 140, and may extend in the third direction Z along a sidewall of the vertical channel region VC. The charge storage structure DS may have a shape that wraps the sidewall of the vertical channel region VC.

As shown in FIG. 5, the charge storage structure DS may include a blocking insulation layer BLL, a charge, storage layer CTL, and a tunnel insulation layer TL. The blocking insulation layer BLL may be disposed between the vertical channel region VC and the gate electrode 140, and the tunnel insulation layer TL may be disposed between the blocking insulation layer BLL and the vertical channel region VC. The charge storage layer CTL may be disposed between the blocking insulation layer BLL and the tunnel insulation layer TL. The blocking insulation layer BLL may include a silicon oxide layer or a high-k dielectric layer (e.g., aluminum oxide (Al2O3), hafnium oxide (HfO2), etc.), the charge storage layer CTL may include a silicon nitride layer, and the tunnel insulation layer TL may include a silicon oxide layer or a high-k dielectric layer (e.g., aluminum oxide (Al2O3), hafnium oxide (HfO2), etc.).

A gap-fill layer 127 may be disposed in an inner space surrounded by the vertical channel VC. The gap-fill layer 127 may include an insulative material such as a silicon oxide layer, a silicon nitride layer, or a silicon oxynitride layer.

Referring back to FIG. 4, a pad D may be disposed on the vertical channel region VC, the charge storage structure DS, and the gap-fill layer 127. The pad D may be electrically connected to the vertical channel region VC. The pad D may include a conductive material or a semiconductor material, which is doped with impurities having a conductivity different from that of the vertical channel region VC.

A horizontal insulation layer 50 may be disposed between the charge storage structure DS and each of the gate electrodes 140. The horizontal insulation layer 150 may extend onto top and bottom surfaces of the gate electrode 140. The horizontal insulation layer 150 may include, for example, a silicon oxide layer (e.g., SiO2) or a high-k dielectric layer (e.g., aluminum oxide (Al2O3), hafnium oxide (HfO2), etc.).

A second interlayer dielectric layer 160 may be disposed on the interlayer dielectric pattern 125a and the stack structures ST. The second dielectric layer 160 may cover a top surface of an uppermost insulation pattern 117a, a top surface of the pad D, and a top surface of the interlayer dielectric pattern 125a. The second interlayer dielectric layer 160 may include, for example, a silicon oxide layer or a silicon nitride layer.

A contact structure CS may be disposed between the stack structures ST that are adjacent to each other in the second direction Y. The contact structure CS may be disposed on the second substrate 100, and extend in the third direction Z to penetrate the interlayer dielectric pattern 125a and the second interlayer dielectric layer 160. The contact structure CS may be electrically connected to the cell impurity region CSR. The contact structure CS may extend in the first direction X along the cell impurity region CSR. As viewed in plan, the contact structure CS may have a linear or rectangular shape extending in the first direction X.

The contact structure CS may include a spacer 141 and a common source contact 141 The common source contact 143 may be electrically connected to the cell impurity region CSR. The common source contact 143 may include, for example, a metal (e.g., tungsten, copper, aluminum, etc.) or a transitional metal (e.g., titanium, tantalum, etc.). The spacer 141 may be disposed between the common source contact 143 and the stack structure ST. The spacer 141 may include, for example, an insulative material (e.g., silicon oxide or silicon nitride).

A third interlayer dielectric layer 180 may be disposed on the second interlayer dielectric layer 160. The third interlayer dielectric layer 180 may cover a top surface of the contact structure CS and a top surface of the second interlayer dielectric layer 160. The third interlayer dielectric layer 180 may include a silicon oxide layer or a silicon nitride layer.

A plurality of cell contact plugs CGCP may be disposed on the end portions of the gate electrodes 140 on the contact region CR of the second substrate 100. The cell contact plugs CGCP may be respectively electrically connected to the gate electrodes 140. An uppermost one of the cell contact plugs CGCP may penetrate the third and second interlayer dielectric layers 180 and 160 and the uppermost insulation pattern 117a, and may be disposed on a top surface of the end portion of the uppermost gate electrode 140. The remaining cell contact plugs CGCP except for the uppermost one of the contact plug CGCP may penetrate the third and second interlayer dielectric layers 180 and 160 and the interlayer dielectric pattern 125a, and may be disposed on the top surfaces of the end portions of the gate electrodes 140. The cell contact plugs CGCP may include at least one of a metal (e.g., tungsten, copper, aluminum, etc.), a conductive metal nitride (e,g., titanium nitride, tantalum nitride, etc.), and a transitional metal (e.g., titanium, tantalum, etc.).

A plurality of global word lines GWL may be disposed on the cell contact plugs CGCP. The global word lines GWL may be electrically connected to the cell contact plugs CGCP. The global word lines GWL may include a metal (e.g., tungsten, copper, etc.).

A plurality of bit line contact plugs BPLG may be disposed on the pads D. The bit line contact plugs BPLG may penetrate the third and second interlayer dielectric layers 180 and 160 on the cell array region CAR of the second substrate 100, and may be electrically connected to the pads D. The bit line contact plugs BPLG may include at, least one of a metal (e.g., tungsten, copper, aluminum, etc.), a conductive metal nitride (e.g., titanium nitride, tantalum nitride, etc.), and a transitional metal (e.g., titanium, tantalum, etc.).

A plurality of bit lines BL may be disposed on the bit line contact plugs BPLG. As shown in FIG. 3, the bit lines BL may run across the stack structures ST in the second direction Y. The bit lines BL may be respectively electrically connected to the vertical channel regions VC, which are arranged in the second direction Y, through the bit line contact plugs BPLG.

Figure 6:
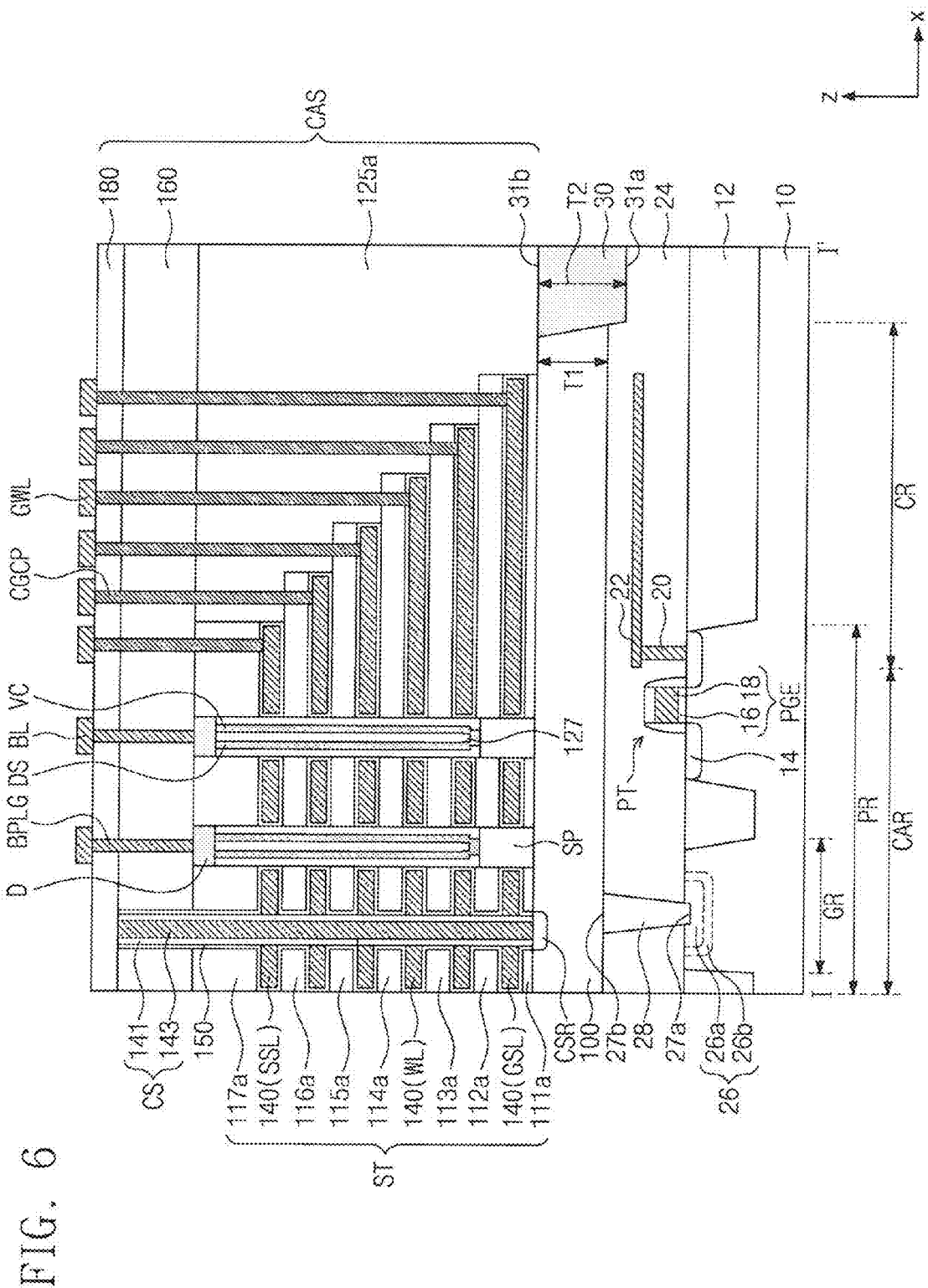
FIG. 6 is a cross-sectional view, taken along line I-I' of FIG. 2, illustrating a semiconductor memory device according to exemplary embodiments of the present inventive concept.

FIG. 6 is a cross-sectional view, taken along line I-I' of FIG. 2, illustrating a semiconductor memory device according to exemplary embodiments of the present inventive concept. Those parts of the present exemplary embodiment configuration substantially the same as those of the foregoing exemplary embodiments are allocated the same reference numerals thereto, and detailed explanation thereof will be omitted for brevity.

Referring to FIG. 6, a semiconductor pillar SP may be disposed between the second substrate 100 and each of the vertical channel regions VC. The semiconductor pillar SP may be disposed on the top surface of the second substrate 100 and penetrate the lowermost one of the gate electrodes 140. The vertical channel region VC may be in contact with and electrically connected to the semiconductor pillar SP. The semiconductor pillar SP may include an intrinsic semiconductor or an extrinsic semiconductor having a conductivity substantially the same as that of the second substrate 100.

Figure 7:
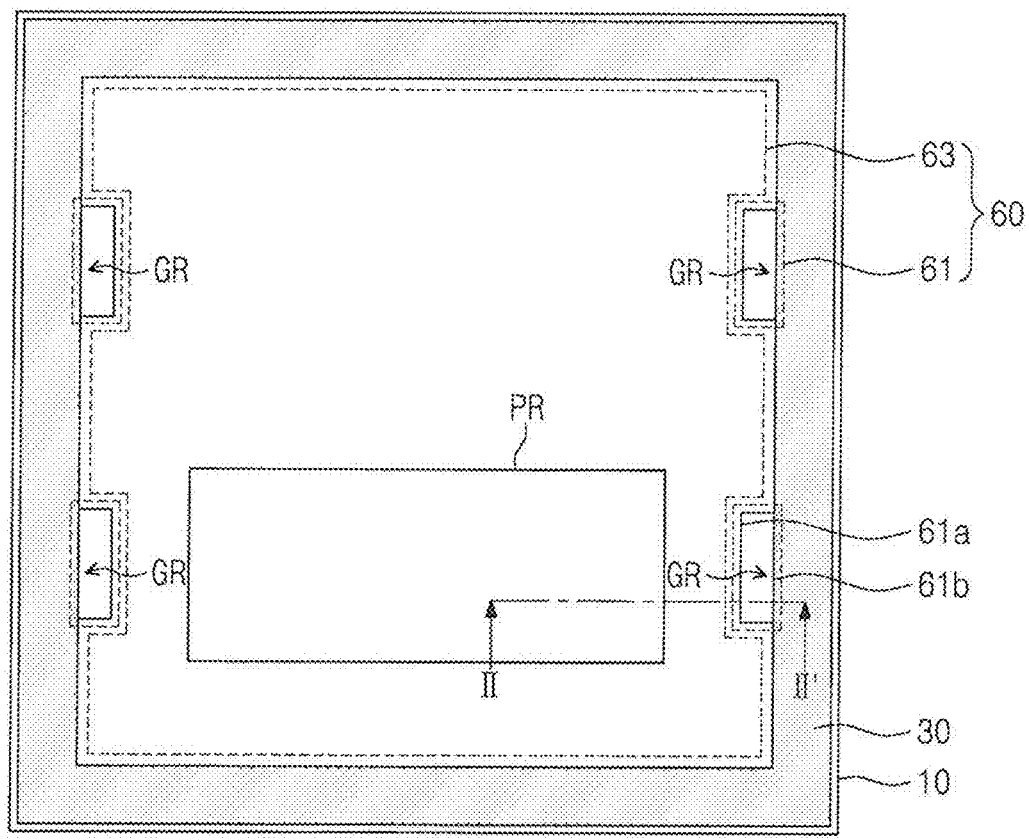
FIG. 7 is a plan view illustrating a unit semiconductor chip including a semiconductor memory device according to exemplary embodiments of the present inventive concept.
Figure 8:
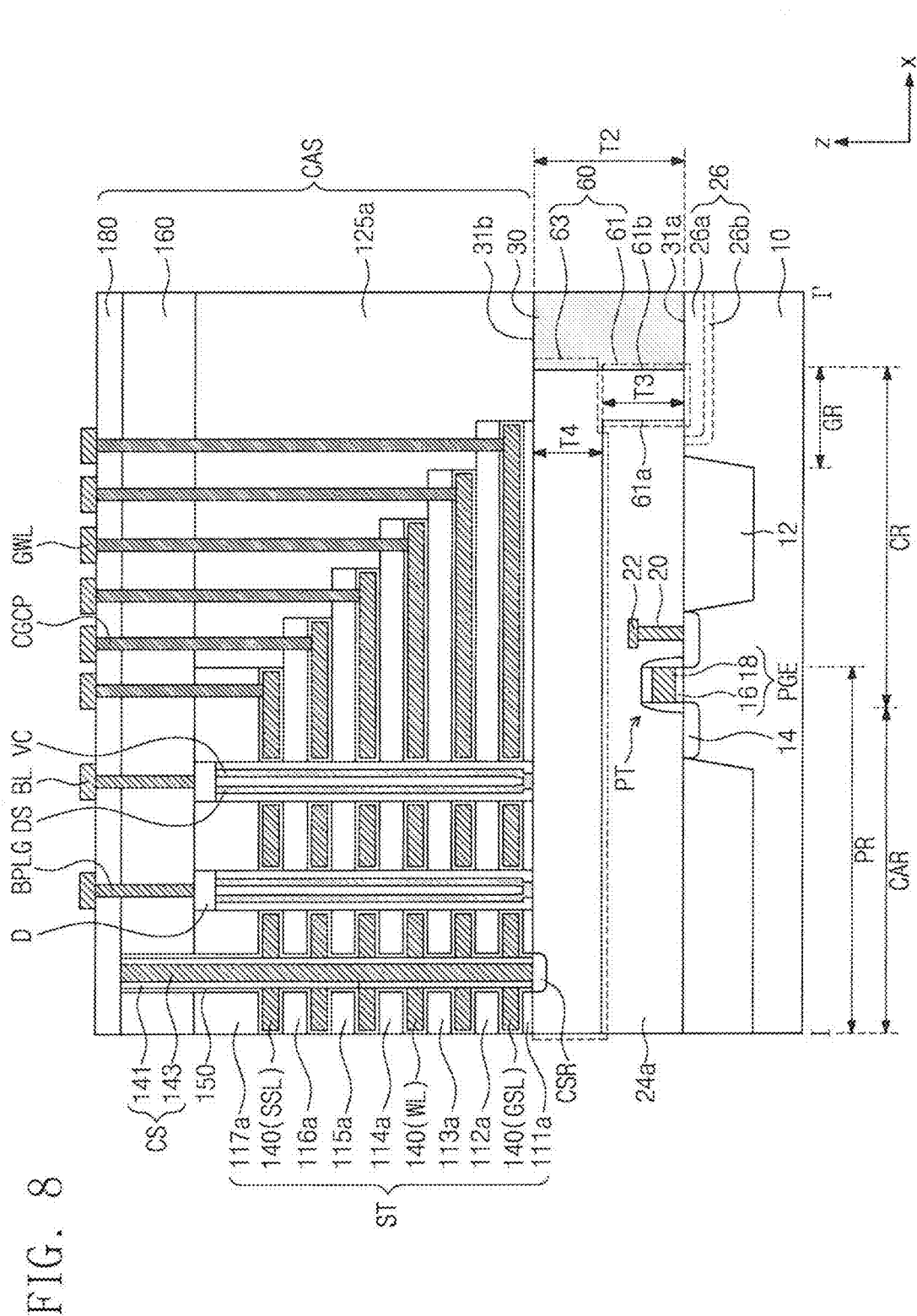
FIG. 8 is a cross-sectional view, taken along line II-II' of FIG. 7, illustrating a semiconductor memory device according to exemplary embodiments of the present inventive concept.

FIG. 7 is a plan view illustrating a unit semiconductor chip including a semiconductor memory device according to exemplary embodiments of the present inventive concept. FIG. 8 is a cross-sectional view, taken along line II-II' of FIG. 7, illustrating a semiconductor memory device according to exemplary embodiments of the present inventive concept. Those parts of the present exemplary embodiment configuration substantially the same as those of the foregoing exemplary embodiments are allocated the same reference numerals thereto and detailed explanation thereof will be omitted for brevity.

Referring to FIGS. 7 and 8, the first substrate 10 may include the peripheral circuit region PR and a plurality of ground regions GR. The ground regions GR may be disposed spaced apart from the peripheral circuit region PR. For example, the peripheral circuit region PR may correspond to a portion of a central part of the first substrate 10, and the ground regions GR may correspond to portions of a circumferential part of the first substrate 10. The ground regions GR of the first substrate 10 may vertically overlap the contact region CR of the second substrate 100.

A first interlayer dielectric pattern 24a may be disposed on the first substrate 10. The first interlayer dielectric pattern 24a may cover the peripheral circuit region PR of the first substrate 10 and expose the ground regions GR. The first interlayer dielectric pattern 24a may include, for example, a silicon oxide layer.

A silicon structure 60 may be disposed on the first interlayer dielectric pattern 24a. The silicon structure 60 may be disposed on the ground regions GR and include silicon patterns 61 in the first interlayer dielectric pattern 24a and a silicon layer 63 extending from the silicon patterns 61 onto a top surface of the first interlayer dielectric pattern 24a.

Each of the silicon patterns 61 may include a first sidewall 61a and a second sidewall 61b facing each other. The first sidewall 61a of the silicon pattern 61 may be in contact with the first interlayer dielectric pattern 24a, and the second sidewall 61b of the silicon pattern 61 may be in contact with the isolation pattern 30. The second sidewall 61b of the silicon pattern 61 may be coplanar with one of sidewalk of the silicon layer 63. The first sidewall 61a of the silicon pattern 61 may be disposed between one of sidewalls of the silicon layer 63 and opposite one of the sidewalk of the silicon layer 63. For example, each of the silicon patterns 61 may correspond to the via 28 of FIG. 4, and the silicon layer 63 may correspond to the second substrate 100 of FIG. 4.

The isolation pattern 30 may be disposed on a top surface of the first substrate 10 and may surround the silicon structure 60. The isolation pattern 30 may wrap sidewalk of the silicon layer 63 while being in contact with the second sidewall 611 of the silicon pattern 61. The top surface 31b of the isolation pattern 30 may be coplanar with a top surface of the silicon layer 63, and the bottom surface 31a of the isolation pattern 30 may be coplanar with a bottom surface of the silicon pattern 61. The thickness T2 of the isolation pattern 30 may be substantially the same as a sum of a thickness T3 of the silicon pattern 61 and a thickness T4 of the silicon layer 63. The thickness T3 of the silicon pattern 61 may be substantially the same as a distance between the bottom surface of the silicon pattern 61 and the top surface of the first interlayer dielectric pattern 24a, and the thickness T4 of the silicon pattern 61 may be substantially the same as a distance between the top surface of the first interlayer dielectric pattern 24a and the top surface of the silicon layer 63.

A detailed description of the cell array structure CAS on the silicon layer 63 may be substantially the same as that discussed with reference to FIGS. 3 and 4, and, thus, the repetitive description will be omitted.

Figure 9:
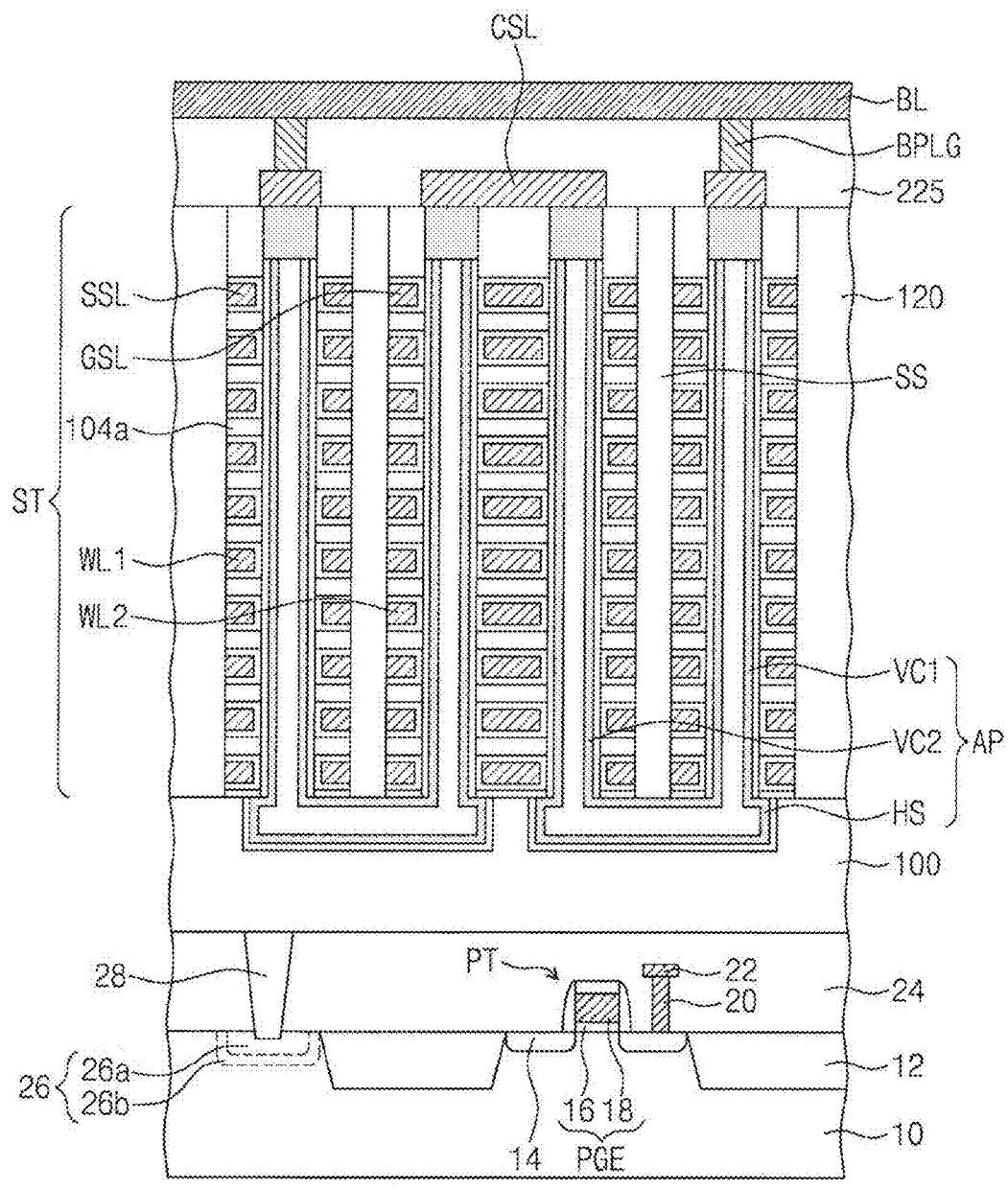
FIG. 9 is a cross-sectional view illustrating a semiconductor memory device according to exemplary embodiments of the present inventive concept.

FIG. 9 is a cross-sectional view illustrating a semiconductor memory device according to exemplary embodiments of the present inventive concept. Those parts of the present exemplary embodiment configuration substantially the same as those of the foregoing exemplary embodiments are allocated the same reference numerals thereto and detailed explanation thereof will be omitted for brevity.

Referring to FIG. 9, the peripheral transistor PT may be disposed on the first substrate 10. The impurity region 26 may be disposed in the first substrate 10, and the first interlayer dielectric layer 24 may be disposed between the first substrate 10 and the second substrate 100. The via 28 may be disposed to penetrate the first interlayer dielectric layer 24 and electrically connected to the impurity region 26, and, thus, the first substrate 10 may be electrically connected to the second substrate 100 through the via 28.

The plurality of stack structures ST may be disposed on the second substrate 100. Each of the stack structures ST may include the insulation patterns 104a and electrodes that are alternately and repeatedly stacked on the second substrate 100. For example, the stack structures ST may extend in one direction, and a separation structure SS may be disposed between the stack structures ST. The separation structure SS may include an insulative material (e.g., silicon oxide, silicon nitride, or silicon oxynitride).

In an embodiment, the electrodes may include the string selection line SSL, the word lines WL1 and WL2, and the ground selection line GSL. The string selection line SSL may be disposed between the bit line BL and the word line WL1 and WL2. The ground selection line GSL may be disposed between the common source line CSL the word line WL1 and WL2. The word lines WL1 and WL2 may be vertically stacked on the second substrate 100. The string selection line SSL and the ground selection line GSL may be disposed on the word lines WL1 and WL2. The string selection line SSL and the ground selection line GSL may be horizontally spaced apart from each other. The word lines WL1 and WL2 may include first word lines WL1 between the second substrate 100 and the string selection line SSL and second word lines WL2 between the second substrate 100 and the ground selection line GSL. The first word lines WL1 may be horizontally spaced apart from the second word lines WL2.

An interlayer dielectric layer 225 may be disposed between the stack structures ST and the bit lines BL. An insulation layer 120 may be disposed between the second substrate 100 and the interlayer dielectric layer 225, such that a side of the stack structure ST may be covered with the insulation layer 120.

Each of active patterns AP may include vertical channel regions VC1 and VC2, which penetrate the stack structure ST and a horizontal channel region HS, which connects the vertical channel regions VC1 and VC2 to each other under the stack structure ST. The vertical channel regions VC1 and VC2 may be provided within vertical holes penetrating through the stack structure ST. The horizontal channel region HS may be provided within a horizontal recess at an upper portion of the second substrate 100. The vertical channel regions VC1 and VC2 may include a vertical channel region VC1, which is connected to one of the bit lines BL and a vertical channel region V2, which is connected to the common source line CSL. The horizontal channel region HS may be disposed between the second substrate 100 and the stack structure ST, and may connect the vertical channel regions VC1 and VC2 to each other.

More specifically, the vertical channel regions VC1 and VC2 may include a first vertical channel VC1, which penetrates the first word lines WL1 and the string selection line SSL and a second vertical channel VC2, which penetrates the second word lines WL2 and the ground selection line GSL. The first vertical channel region VC1 may be connected to one of the bit lines BL, and the second vertical channel region VC2 may be connected to the common source line CSL. The horizontal channel region HS may extend from under the first word lines WL1 toward under the second word lines WL2, such that the first vertical channel region VC1 may be connected to the second vertical channel region VC2.

Each of the active patterns AP may include a semiconductor pattern that penetrates the stack structure ST and is electrically connected to the second substrate 100. The semiconductor pattern included in the vertical channel regions VC1 and VC2 may cover inner walls of vertical holes formed in the stack structure ST. The semiconductor pattern included in the horizontal channel region HS may cover inner walls of the horizontal recess formed in the second substrate 100. The semiconductor pattern may include a semiconductor material.

FIGS. 10A to 15A are plan views illustrating a method for fabricating a semiconductor memory device according to exemplary embodiments of the present inventive concept. FIGS. 10B to 15B and 16 to 20 show a method for fabricating a semiconductor memory device according to exemplary embodiments of the present inventive concept. FIGS. 10B to 15B are cross-sectional views taken along line I-I' of FIGS. 10A to 15A, respectively. FIGS. 16 to 20 are cross-sectional views illustrating subsequent processes after those illustrated in 15A.

Figure 10A:
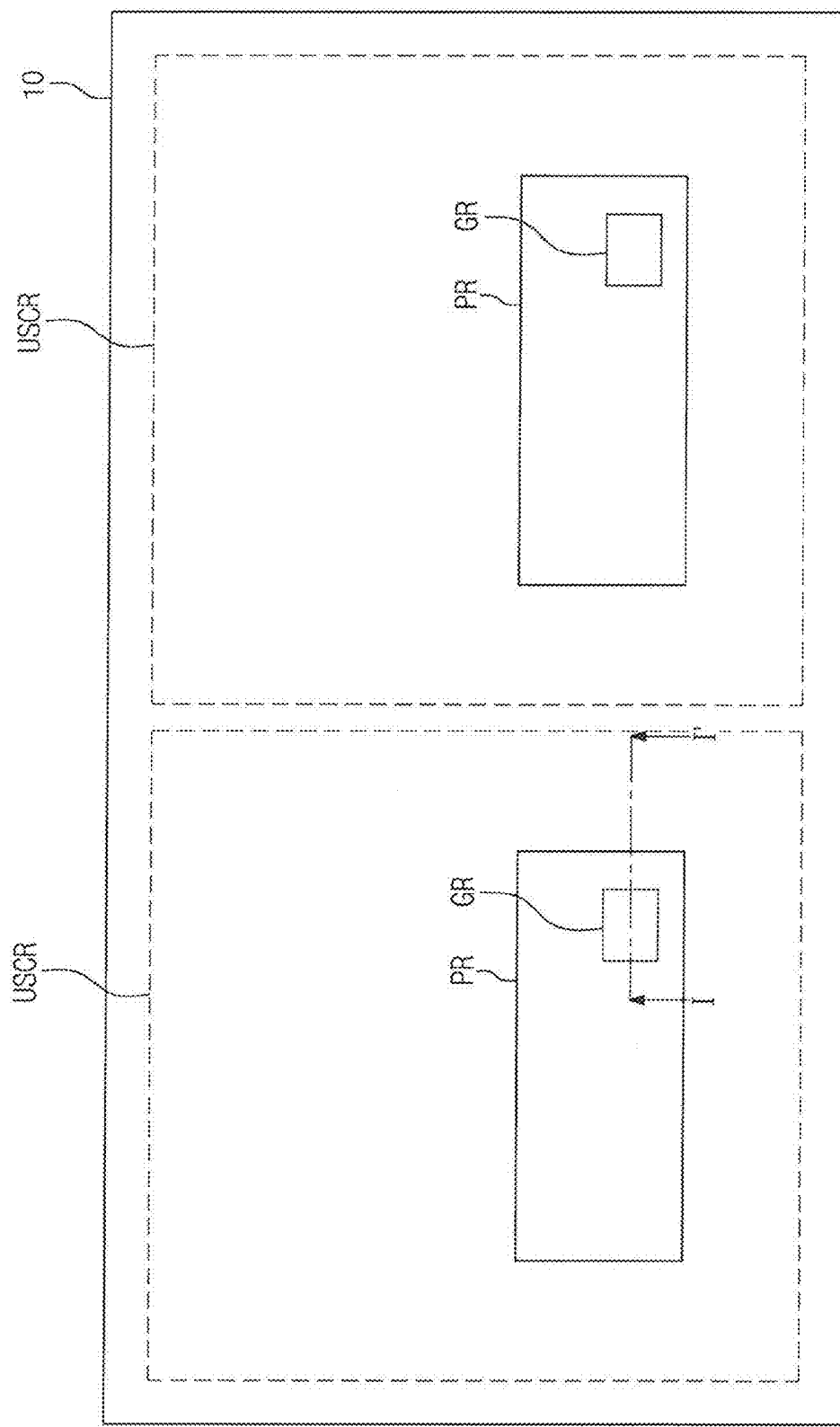
Figure 10B:
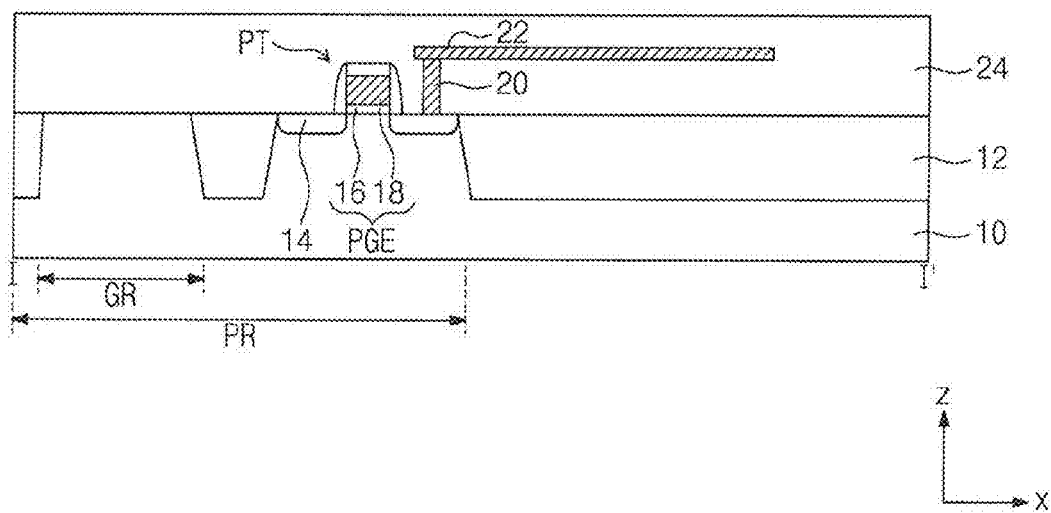

Referring to FIGS. 10A and 10B, a first substrate 10 may be provided to include a plurality of unit semiconductor chip regions USCR. Each of the unit semiconductor chip regions USCR may be a region on which a single unit semiconductor chip of FIG. 2 is formed.

A device isolation layer 12 may be provided in the first substrate 10. The device isolation layer 12 may define active sections in each of the unit semiconductor chip regions USCR of the first substrate 10. In the unit semiconductor chip region USCR, the active sections of the first substrate 10 may include a peripheral circuit region PR and a ground region GR. For example, the ground region GR may be disposed within the peripheral circuit region PR. More specifically, the ground region GR may correspond to a portion of the peripheral circuit region PR. The first substrate 10 may be, for example, a single crystalline silicon substrate, a silicon-germanium substrate, a germanium substrate, or a single crystalline epitaxial layer grown on a single crystalline silicon substrate. For example, the first substrate 10 may have a first conductivity (e.g., p-type).

A peripheral circuit gate electrode PGE may be formed on the peripheral circuit region PR of the first substrate 10. The peripheral circuit gate electrode PGE may include a gate dielectric pattern 16 formed on the first substrate 10 and a gate conductive pattern 18 formed on the gate dielectric pattern 16.

A plurality of source/drain regions 14 may be formed on opposing sides of the peripheral circuit gate electrode PGE in the first substrate 10. The source/drain regions 14 may be formed using an ion implant process to implant the first substrate 10 with impurities having a conductivity opposite to that of the first substrate 10. The peripheral circuit gate electrode PGE and the source/drain regions 14 may constitute a peripheral transistor PT.

A contact plug 20 may be formed on the first substrate 10 and connected to one of the source/drain regions 14. A conductive line 22 may be formed on and connected to the contact plug 20. The contact plug 20 and the conductive line 22 may include at least one of a metal (e.g., W, Cu, etc.) and a metal nitride (e.g., TiN, WN, etc.).

A first interlayer dielectric layer 24 may be formed on the first substrate 10. The first interlayer dielectric layer 24 may cover a top surface of the first substrate 10, the peripheral circuit gate electrode PGE, the contact plug 20, and the conductive line 22. The first interlayer dielectric layer 24 may include, for example, a silicon oxide layer, a silicon nitride layer, or a silicon oxynitride layer.

Figure 11A:
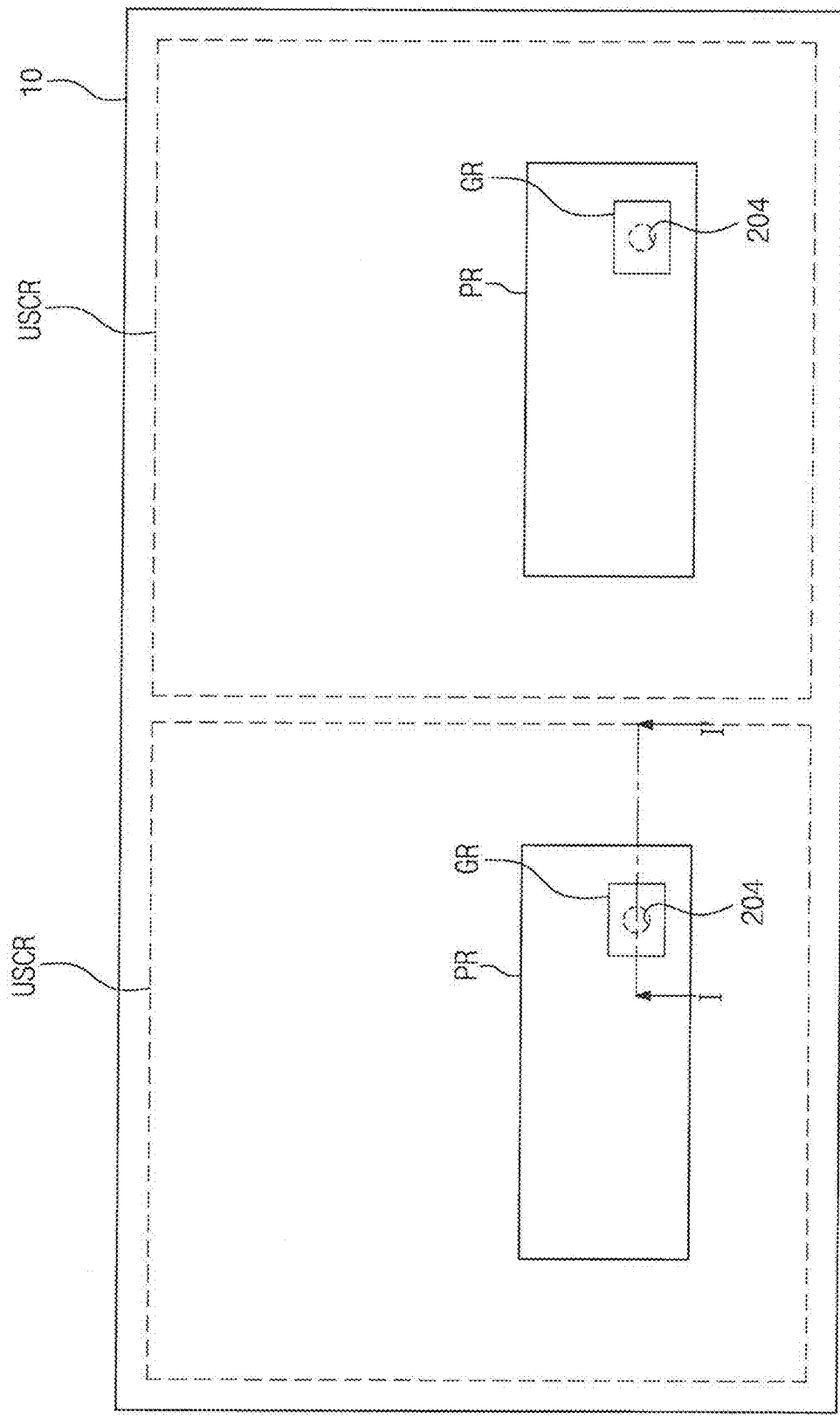
Figure 11B:
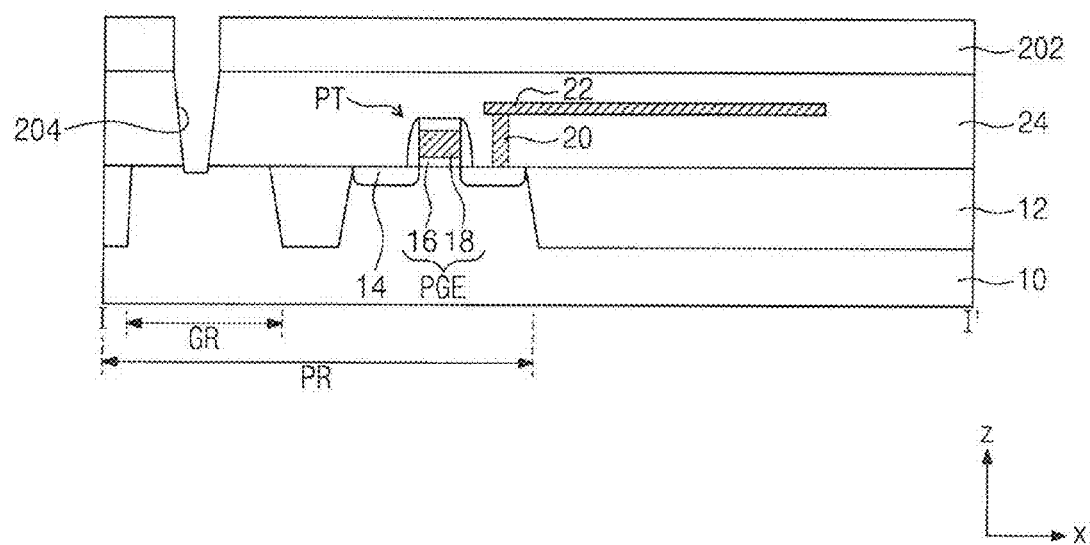

Referring to FIGS. 11A and 11B, a resist pattern 202 may be formed on the first interlayer dielectric layer 24. The resist pattern 202 may partially expose the ground region GR of the first substrate 10.

A portion of the first interlayer dielectric layer 24 partially exposed through the resist pattern 202 may be etched to form a via hole 204 in the first interlayer dielectric layer 24. The via hole 204 may partially expose the top surface of the first substrate 10 in the ground region GR. The resist pattern 202 may be removed after the etch process.

Figure 12B:
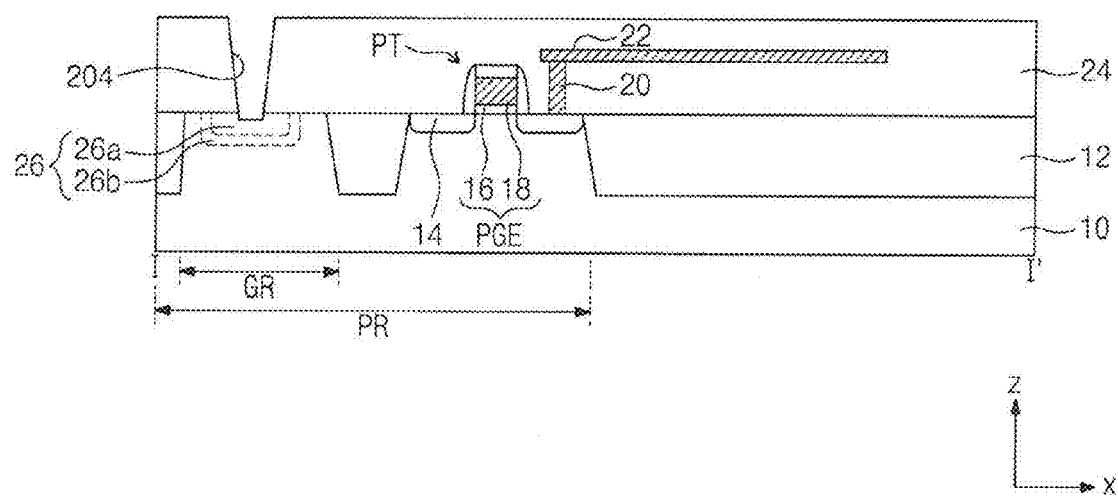

Referring to FIGS. 12A and 12B, an impurity region 26 may be formed in the ground region GR, which is partially exposed through the via hole 204, of the first substrate 10. The impurity region 26 may be formed by performing an ion implant process on the partially exposed around region PR of the first substrate 10 so as to form a preliminary impurity region and performing a heat treatment on the preliminary impurity region so as to diffuse impurities included in the preliminary impurity region. The impurity region 26 may have conductivity different from that of the first substrate 10. For example, when the first substrate 10 has a p-type conductivity, the impurity region 26 may have an n-type conductivity.

The impurity region 26 may include a first impurity region 26a and a second impurity region 26b enveloping the first impurity region 26a. For example, the first impurity region 26a may have an impurity concentration greater than that of the second impurity region 26b.

Figure 13B:
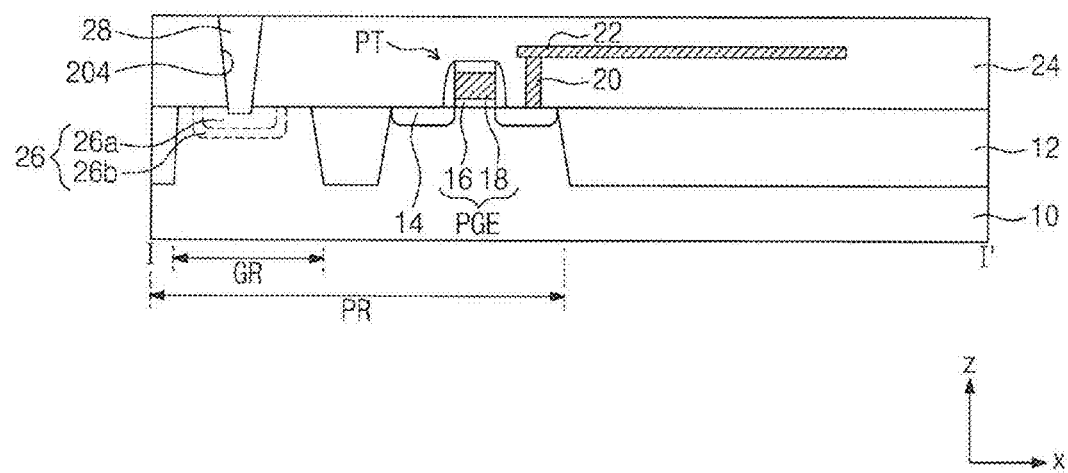

Referring to FIGS. 13A and 13B, a via 28 may be formed in the via hole 204. The via 28 may be formed by forming on the first interlayer dielectric layer 24 a conductive layer (not shown) that fills the via hole 204 and planarizing the conductive layer until a top surface of the first interlayer dielectric layer 24 is exposed. The via 28 may include, for example, a polysilicon layer.

Figure 14B:
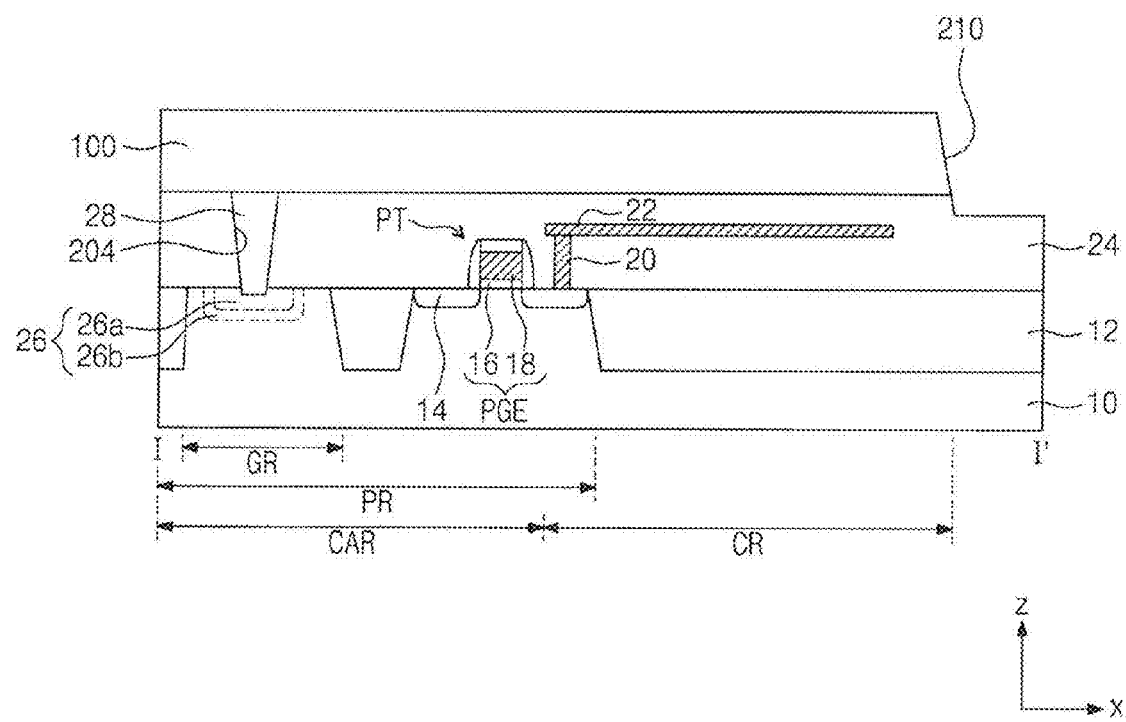

Referring to FIGS. 14A and 14B, a second substrate 100 may be formed on the first interlayer dielectric layer 24. The second substrate 100 may be formed by forming a silicon layer (not shown) that covers top surfaces of the first interlayer dielectric layer 24 and the via 28 and patterning the silicon layer. The second substrate 100 may be formed on each of the unit semiconductor chip regions USCR. As shown in FIG. 3, the second substrate 100 may include a cell array region CAR and a contact region CR around the cell array region CAR.

After forming the second substrate 100, an etching region 210 may be formed between the second substrates 100 adjacent to each other. The etching region 210 may be a patterned region of the silicon layer constituting the second substrate 100. The etching region 210 may partially expose the first interlayer dielectric layer 24 between the adjacent second substrates 100.

Figure 15B:
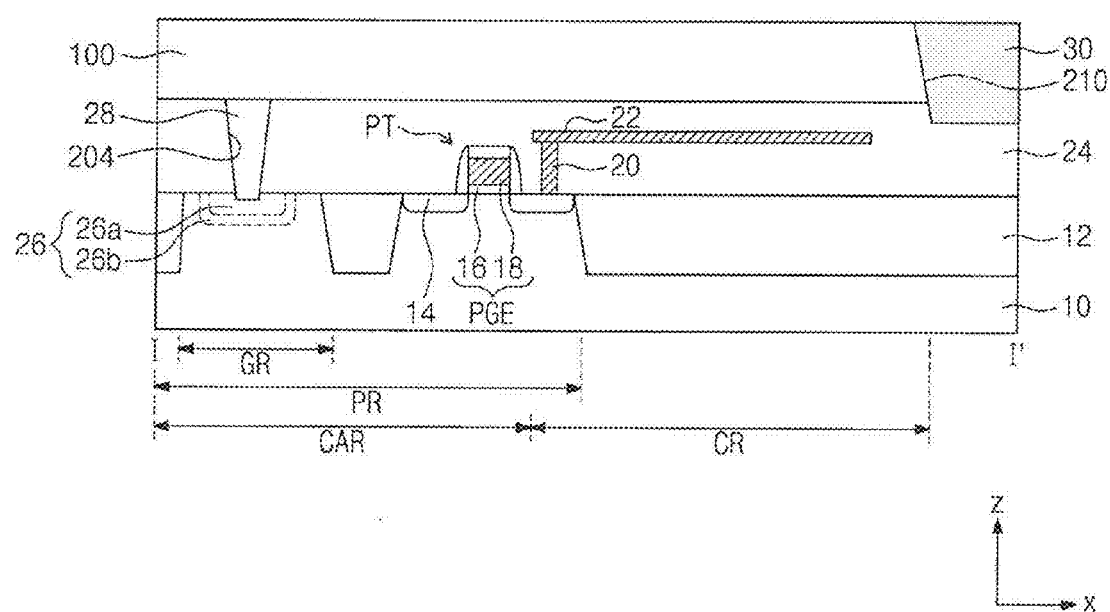

Referring to FIGS. 15A and 15B, an isolation pattern 30 may be formed in the etching region 210. The isolation pattern 30 may be formed by forming an insulation layer (not shown) that covers the top surface of the first interlayer dielectric layer 24 and fills the etching region 210 and then planarizing the insulation layer until the top surface of the first interlayer dielectric layer 24 is exposed.

Figure 16:
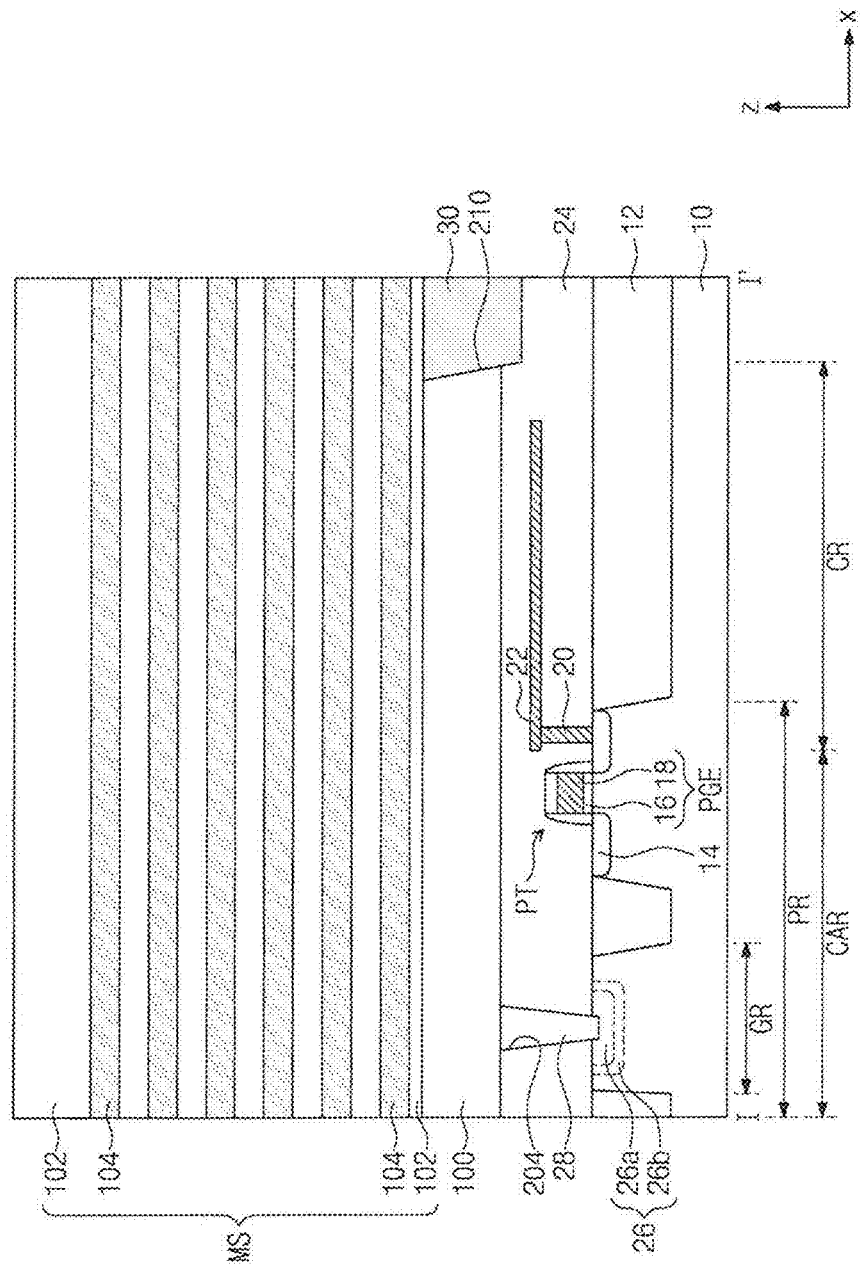

Referring to FIG. 16, a mold structure MS may be formed on the second substrate 100. The mold structure MS may include insulation layers 102 and sacrificial layers 104. The insulation layers 102 and the sacrificial layers 104 may be alternately and repeatedly stacked on the second substrate 100. The sacrificial layers 104 may include a material having an etch selectivity with respect to the insulation layers 102. For example, the sacrificial layers 104 may include a silicon nitride layer, and the insulation layers 102 may include a silicon oxide layer.

Figure 17:
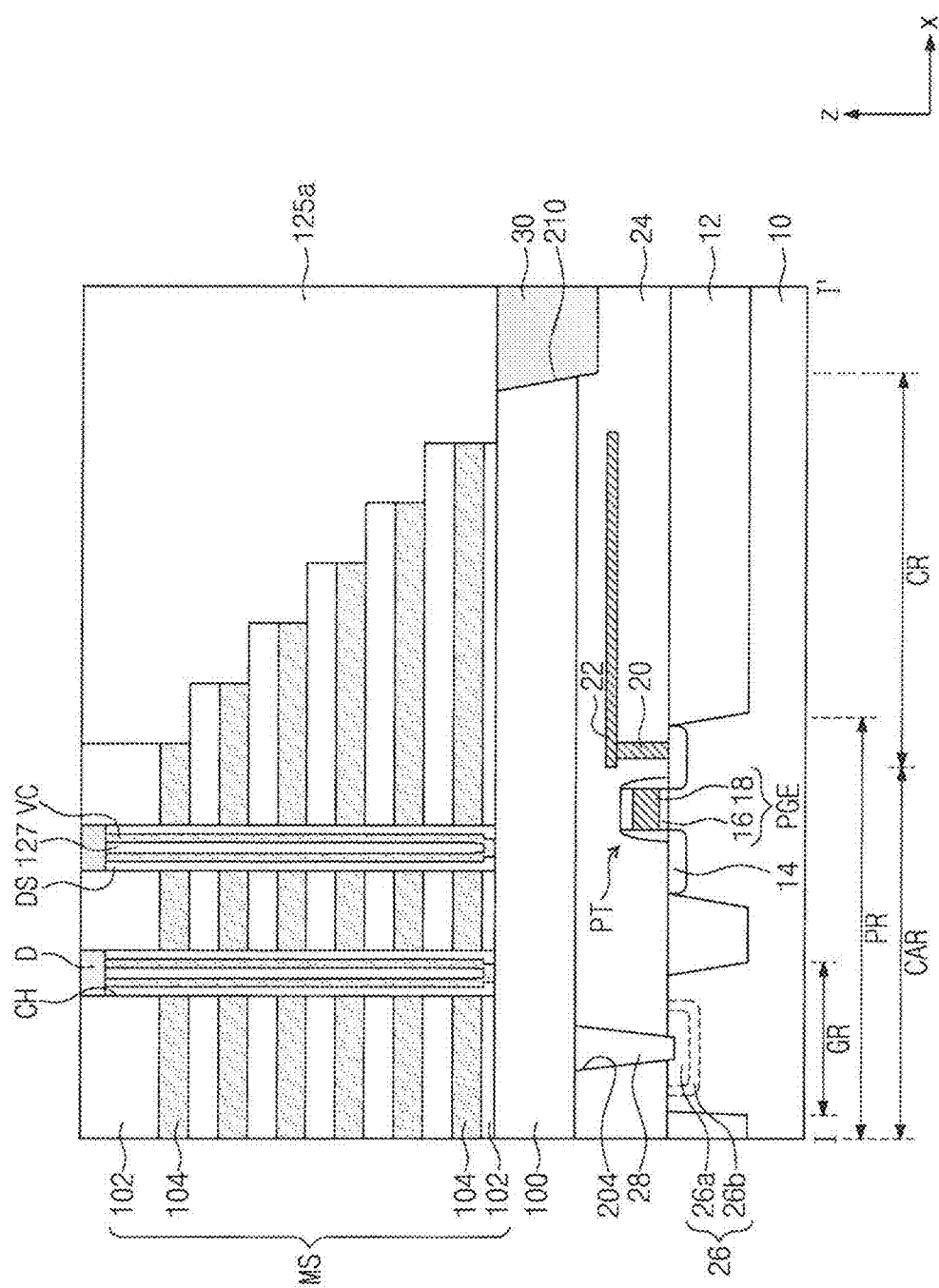

Referring to FIG. 17, the mold structure MS may be patterned to form channel holes CH on the cell array region CAR of the second substrate 100. Specifically, the channel holes CH may be formed by forming on the mold structure MS a mask pattern (not shown) including openings through which portions of the mold structure MS are exposed and sequentially etching the insulation layers 102 and the sacrificial layers 104 that are exposed through the openings. The patterning process for forming the channel holes CH may be performed until a top surface of the second substrate 100 is exposed. An anisotropic etch process may be carried out to form the channel holes CH each having a constant width along its height from the second substrate 100. Alternatively, the anisotropic etch process may be performed to form the channel holes CH each having a variable width along its height from the second substrate 100. In other words, the channel holes CH may have sloped inner walls. The anisotropic etch process may be a dry etch process (e.g., a plasma etch process). As viewed in plan, the channel holes CH may have a circular, elliptical, or polygonal shape.

The channel holes CH may be formed by patterning the mold structure MS using a dry etch process. The dry etch process may be performed until the channel holes CH are completely formed all over the mold structure MS. As the etch process is performed, the number of the channel holes CH is increased such that etching ions accumulate in the channel holes CH while contacting the top surface of the second substrate 100 and electrons increase on a top surface of the mold structure MS. As a result, the mold structure MS may suffer from breakdown between the electrons and the second substrate 100, which is in a floating state where cations accumulate.

In an embodiment, the via 28 may electrically connect the second substrate 100 to the first substrate 10, which is in a ground state, such that it may be possible to reduce or prevent the mold structure MS from the breakdown during the etch process.

A charge storage structure DS may be formed in each of the channel holes CH. The charge storage structure DS may conformally cover a sidewall of the channel hole CH and a portion of the top surface of the second substrate 100. Specifically, the charge storage structure DS may be formed by forming a deposition layer (not shown) covering the sidewall of the channel hole CH and the top surface of the second substrate 100, which is exposed through the channel hole CH and partially etching the deposition layer to expose a portion of the top surface of the second substrate 100. The charge storage structure DS may be formed using, for example, a chemical vapor deposition (CVD) or an atomic layer deposition (ALD).

Specifically, as shown in FIG. 5, the charge storage structure DS may include a blocking insulation layer BLL, a charge storage layer CTL, and a tunnel insulation layer TL that are sequentially formed on, the sidewall of the channel hole CH and the portion of the top surface of the second substrate 100. For example, the blocking insulation layer BLL may be formed of a silicon oxide layer or a high-k dielectric layer (e.g., Al2O3, HfO2, etc,), the charge storage layer CTL may be formed of a silicon nitride layer, and the tunnel insulation layer TL may be formed of a silicon oxide layer or a high-k dielectric layer (e.g., Al2O3, HfO2, etc.).

As shown in FIG. 6, prior to formation of the charge storage structure DS, a semiconductor pillar SP may be formed on the second substrate 100 exposed through the channel hole CH. Specifically, the semiconductor pillar SP may be formed by performing a selective epitaxial growth using the second substrate 100 as a seed layer. The semiconductor pillar SP may include, for example, polysilicon.

Returning to FIG. 17, a vertical channel region VC may be formed in the channel hole CH in which the charge storage structure DC is formed. The vertical channel hole CH may conformally cover a surface of the charge storage structure DS and a top surface of the second substrate 100 exposed through the charge storage structure DS. The vertical channel region VC may include a semiconductor material. For example, the vertical channel region VC may include at least one of a polycrystalline silicon layer, an organic semiconductor layer, and a carbon nanostructure.

A gap-fill layer 127 may be formed in an inner space surrounded by the vertical channel region VC in the channel hole CH. The gap-fill layer 127 may completely fill the channel hole CH. The gap-fill layer 127 may be formed using a SOG (spin on glass) technique. The gap-fill layer 127 may include an insulative material, for example, a silicon oxide layer and/or a silicon nitride layer.

A pad D may be formed on the charge storage structure DS, the vertical channel region VC, and the gap-fill layer 127. The pad D may be formed by etching upper portions of the vertical channel region VC and the gap-fill layer 127 to form a recess and filling the recess with a conductive material. Alternatively, the pad D may be formed by doping an upper portion of the vertical channel region VC with impurities having a conductivity different from that of the vertical channel region VC.

A mask pattern (not shown) may be formed on the mold structure MS on the cell array region CAR of the second substrate 100. And, an etch process may be performed on the mold structure MS formed on the contact region CR of the second substrate 100. Accordingly, the mold structure MS may be patterned to have a stair-stepped structure on the contact region CR of the second substrate 100.

The stair-stepped mold structure MS may be formed by repeatedly etching the insulation, layers 102 and the sacrificial layers 104 using the mask pattern that is gradually reduced by repeatedly etching sidewalls thereof. The repetitive etching of the insulation layers 102 and the sacrificial layers 104 using the gradually reduced mask patterns may allow the mold structure MS to have the stair-stepped structure at its side on the contact region CR of the second substrate 100. For example, the sacrificial layers 104 and the insulation layers 102 may have horizontal areas that are gradually reduced with increasing distance from the second substrate 100. After the etch process for forming the stair-stepped mold structure MS, a top surface of the isolation pattern 30 may be exposed. A process may be performed to remove the mask pattern remaining on the cell array region CAR of the second substrate 100.

An interlayer dielectric pattern 125a may be formed on the contact region CR of the second substrate 100. The interlayer dielectric pattern 125a may be formed by forming an insulation layer (not shown) on the second substrate 100 and planarizing the insulation layer until a top surface of the uppermost insulation layer 102 is revealed. The interlayer dielectric layer 125a may cover a top surface of the second substrate 100 on the contact region CR, the top surface of the isolation pattern 30, and a surface of the stair-stepped structure of the mold structure MS on the contact region CR. The interlayer dielectric layer 125a may have a top surface coplanar with the top surface of the uppermost insulation layer 102.

The interlayer dielectric layer 125a may be formed using, for example, a physical vapor deposition (PVD), a chemical vapor deposition (CVD), a sub-atmosphere chemical vapor deposition (SACVD), a low pressure chemical vapor deposition (LPCVD), a plasma enhanced chemical vapor deposition (PECVD), or a high density plasma chemical vapor deposition (HDP CVD).

The interlayer dielectric pattern 125a may be formed of a material having an etch selectivity with respect to the sacrificial layers 104. The interlayer dielectric pattern 125a may include, for example. HDP (high density plasma) oxide, TEOS (tetraethylorthosilicate), PE-TEOS (plasma enhanced tetraethylorthosilicate), O3-TEOS (O3-tetraethylorthosilicate), USG (undoped silicate glass), PSG (phosphosilicate glass), BSG (borosilicate glass), BPSG (borophosphosilicate glass), FSG (fluoridesilicate glass), SOG (spin on glass), TOSZ (tonen silazene), or any combination thereof. Alternatively, the interlayer dielectric layer 125a may include silicon nitride, silicon oxynitride, or a low-k material having a low dielectric constant.

Figure 18:
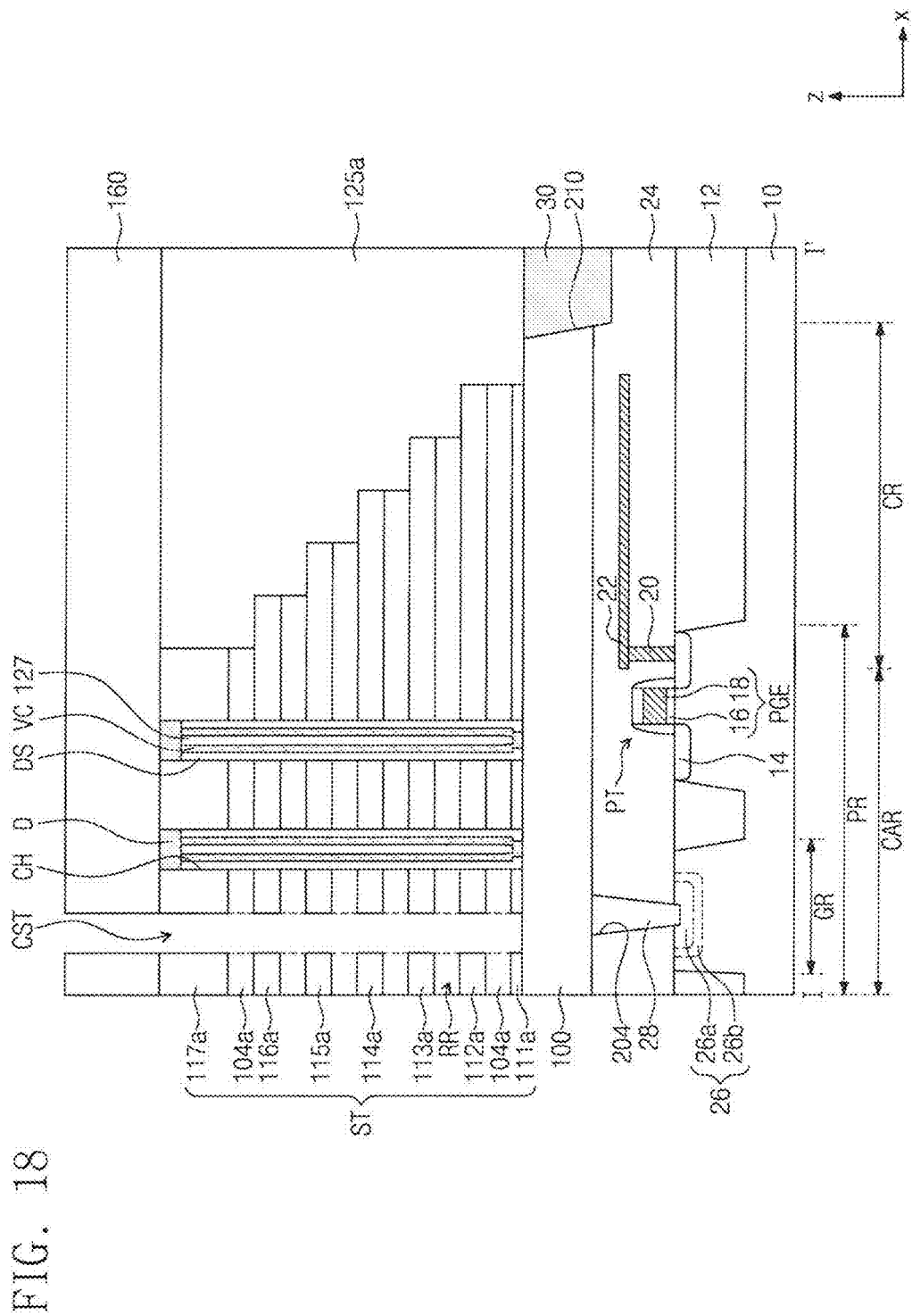

Referring to FIG. 18, a second interlayer dielectric layer 160 may be formed on the interlayer dielectric layer 125a and the mold structure MS. The second interlayer dielectric layer 160 may include one or more openings on the cell array region CAR.

The mold structure MS may be patterned by an etch process using the second interlayer dielectric layer 160 as an etch mask so as to form a common source trench CST in the mold structure MS. The common source trench CST may be formed by performing an anisotropic etch process on the mold structure MS until the top surface of the second structure 100 is revealed. As viewed in plan, the common source trench CST may be formed to have a rectangular or line shape extending in the first direction X.

The mold structure MS may be patterned to form a plurality of stack structures ST that are arranged spaced apart from each other in the second direction Y. Each of the stack structures ST may include sacrificial patterns 104a and insulation patterns 111a to 117a that are alternately stacked on the second substrate 100. The sacrificial patterns 104a and the insulation patterns 111a to 117a may have sidewalls exposed through the common source trench CST.

The sacrificial patterns 104a exposed through the common source trench CST may be removed to form recess regions RR. The second interlayer dielectric layer 160 and insulation patterns 111a to 117a having an etch selectivity with respect to the sacrificial patterns 104a may not be etched during the removal of the sacrificial patterns 104a. The etch process for forming the recess regions RR may be a wet etch process and/or a dry etch process. When the insulation patterns 111a to 117a and the second interlayer dielectric layer 160 are formed of a silicon oxide layer and the sacrificial patterns 104a are formed of a silicon nitride layer, the etch process may be performed using a phosphoric acid containing etchant.

The recess regions RR may be formed between the insulation patterns 111a to 117a that are vertically stacked. The recess regions RR may be gap regions extending from the common source trench CST toward the insulation patterns 111a to 117a.

Figure 19:
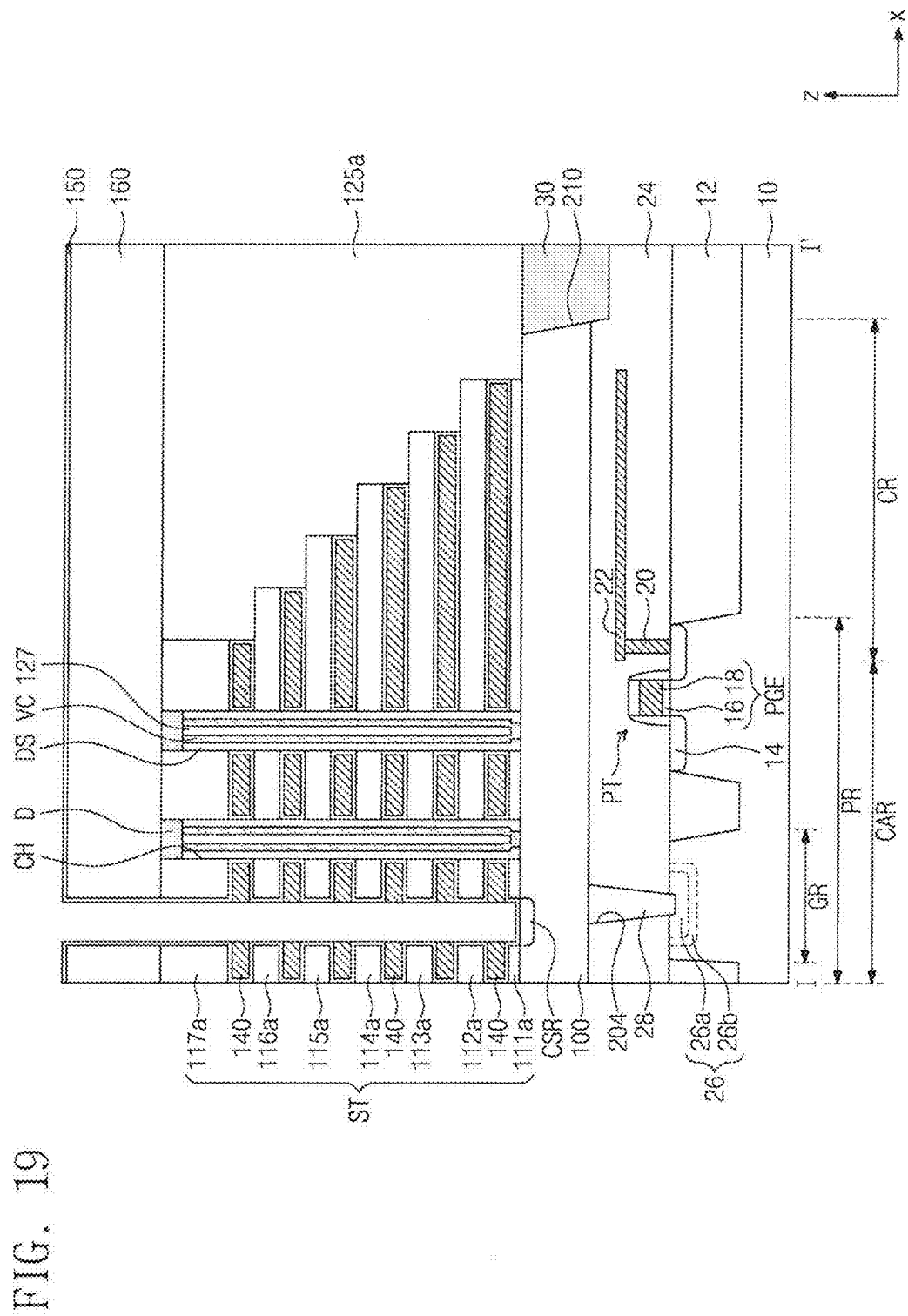

Referring to FIG. 19, a horizontal layer 150 may be formed in the recess regions RR. Specifically, the horizontal layer 150 may conformally cover top and bottom surfaces of the insulation patterns 111a to 117a exposed through the recess regions RR, sidewalls of the insulation patterns 111a to 117a exposed through the common source trench CST, outer sidewalls of the charge storage structure DS exposed through each of the recess regions RR, and the top surface of the second substrate 100 exposed through the common source trench CST. The horizontal layer 150 may be formed using a deposition method whose step coverage is superior. For example, the horizontal layer 150 may be formed using a chemical vapor deposition (CVD) or an atomic layer deposition (ALD). The horizontal layer 150 may include a silicon oxide layer SiO2) or a high-k dielectric layer (e.g., aluminum oxide (Al2O3), hafnium oxide (HfO2), etc.).

A plurality of gate electrodes 140 may be formed by filling the recess regions RR with a conductive material. The formation of the gate electrodes 140 may include forming a conductive layer that fills the common source trench CST and the recess regions RR and covers a top surface of the second interlayer dielectric layer 160 and then partially removing the conductive layer formed in the common source trench CST and on the top surface of the second interlayer dielectric layer 160 so that the conductive layer remains locally in the recess regions RR. An anisotropic etch process may be performed to remove the conductive layer formed in the common source trench CST and on the top surface of the second interlayer dielectric layer 160. The gate electrodes 140 may include a conductive material. For example, the gate electrodes 140 may include at least one of doped silicon, a metal (e,g, tungsten, copper, aluminum, etc.), a conductive metal nitride (e.g., titanium nitride, tantalum nitride, etc.), and a transitional metal (e,g., titanium, tantalum, etc.).

A cell impurity region CSR may be formed in the second substrate 100 exposed through the common source trench CST. The cell impurity region CSR may be formed by performing an ion implant process on the second substrate 100. The cell impurity region CSR may have a conductivity different from that of the second substrate 100.

Figure 20:
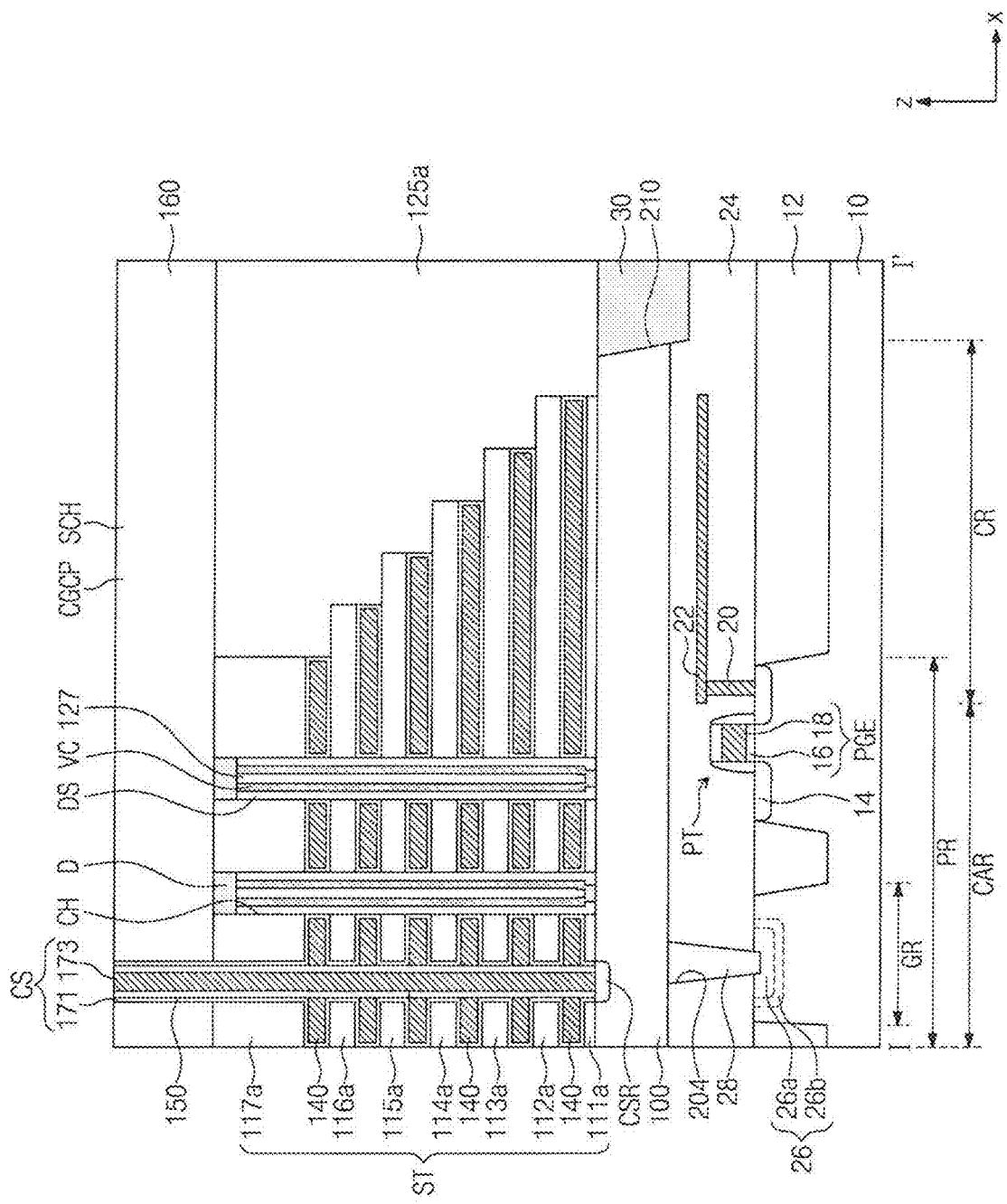

Referring to FIG. 20, a contact structure CS may be formed in the common source trench CST. The contact structure CS may include a spacer 171 and a common source contact 173. The spacer 171 may cover a sidewall of the common source contact CST. Specifically, the formation of the spacer 171 may include forming an insulation layer (not shown) covering a floor surface and the sidewall of the common source trench CST and then partially etching the insulation layer covering the floor surface of the common source trench CST.

When the insulation layer is partially etched for forming the spacer 171, a portion of the horizontal layer 150 covering the top surfaces of the second substrate 100 and the second interlayer dielectric layer 160 may be etched simultaneously with the insulation layer. Accordingly, the top surface of the second substrate 100 may be exposed through the common source trench CST in which the spacer 171 is formed and the top surface of the second interlayer dielectric layer 160 is exposed. The spacer 171 may include a silicon oxide layer and a silicon nitride layer.

The common source contact 173 may be formed to fill the common source trench CST including the spacer 171 formed therein. The common source contact 173 may be formed by performing, for example, a chemical vapor deposition (CVD), a physical vapor deposition (PVD), or an atomic layer deposition (AM). The common source contact 173 may include at least one of a metal (e.g., tungsten, copper, aluminum, etc.) or a transitional metal (e.g., titanium, tantalum, etc.).

Referring back to FIG. 4, a third interlayer dielectric layer 180 may be formed on the second interlayer dielectric layer 160. The third interlayer dielectric layer 180 may be formed to cover the top surface of the second interlayer dielectric layer 160 and a top surface of the contact structure CS. The third interlayer dielectric layer 180 may include a silicon oxide layer or a silicon nitride layer.

A plurality of cell contact plugs CGCP may be formed on the contact region CR of the second substrate 100. The cell contact plugs CGCP may be formed by sequentially etching the third interlayer dielectric layer 180, the second interlayer dielectric layer 160, the interlayer dielectric pattern 125*a*, and the insulation patterns 111*a* to 117*a* so as to form cell contact holes SCH thorough which end portions of the gate electrodes 140 are exposed and then filling the cell contact holes SCH with a conductive material. The cell contact plugs CGCP may include at least one of a metal (e.g., tungsten, copper, aluminum, etc.) or a transitional metal (e.g., titanium, tantalum, etc.).

A plurality of bit line contact plugs BPLG may be formed to penetrate the third and second interlayer dielectric layers 180 and 160 formed on the cell array region CAR of the second substrate 100. The bit line contact plugs BPLG may be connected to the pads D. The bit line contact plugs BPLG may include a metal (e.g., tungsten).

A plurality of bit lines B and a plurality of global word lines GWL may be formed on the third interlayer dielectric layer 180. Bit lines BL and Global word lines OWL may be formed by depositing a conductive layer and patterning the conductive layer.

Specifically, as shown in FIG. 3, the bit lines BL may run across the stack structures ST arranged spaced apart from each other in the second direction Y and be electrically connected to the bit line contact plugs BPLG. The global word lines GWL may be electrically connected to the bit line contact plugs BPLG.

FIGS. 21A to 27A are plan views illustrating a method for fabricating a semiconductor memory device according to exemplary embodiments of the present inventive concept. FIGS. 21B to 27B are cross-sectional views, taken along line II-II' of FIGS. 21A to 27A, respectively, illustrating a method for fabricating a semiconductor memory device according to exemplary embodiments of the present inventive concept.

Figure 21A:
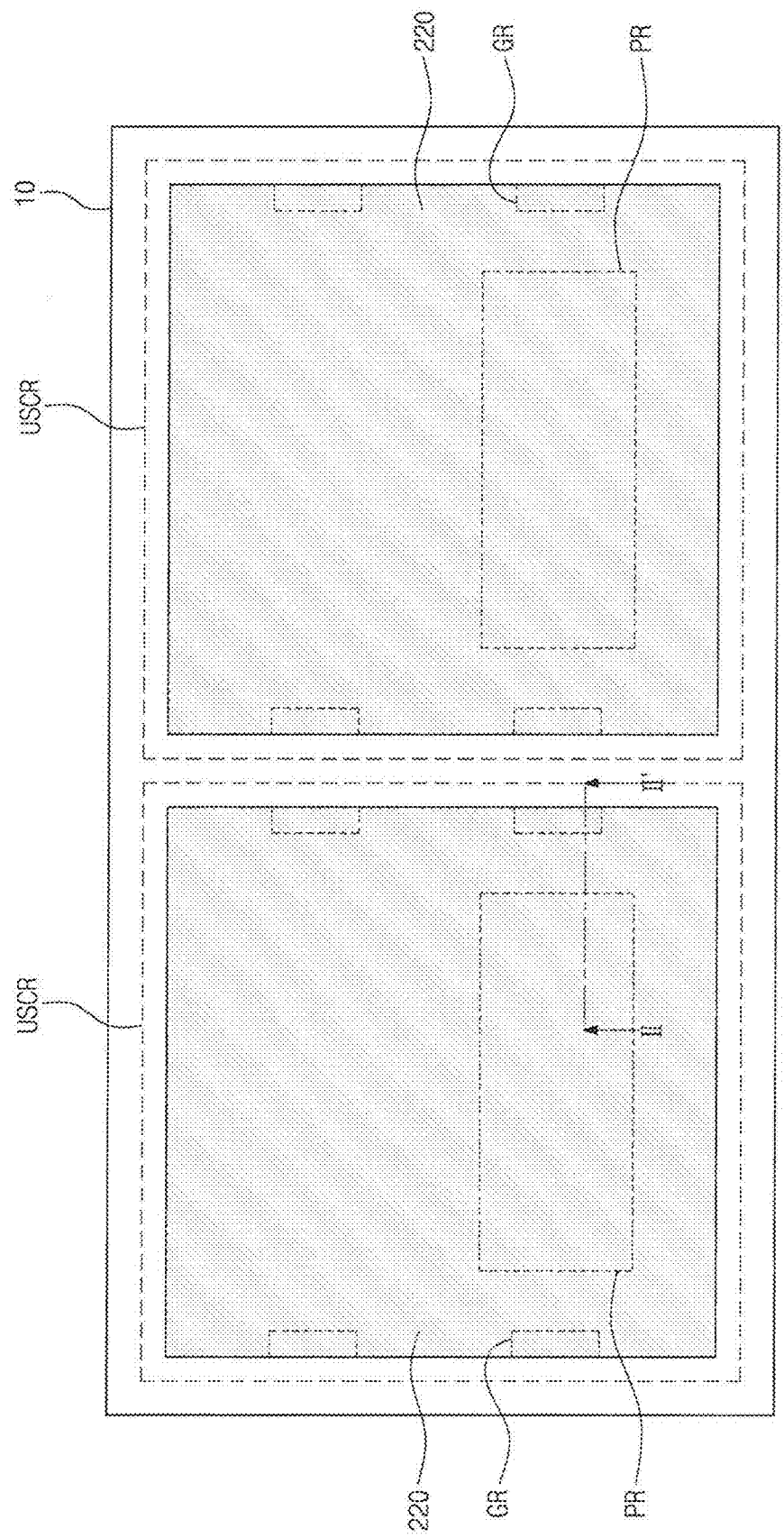
Figure 21B:
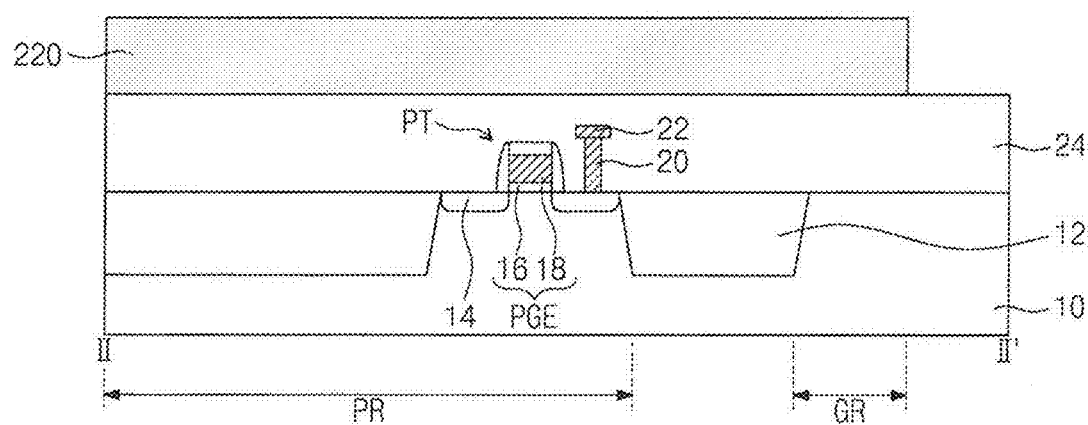

Referring to FIGS. 21A and 21B, a first substrate 10 may include active sections each having a peripheral circuit region PR and ground regions CR in each of unit semiconductor chip regions USCR. The peripheral circuit region PR and the ground regions GR may be arranged spaced from each other. For example, the peripheral circuit region PR may correspond to a portion of a central part of the first substrate 10. The ground regions GR may correspond to portions of a circumferential part of the first substrate 10. A description discussed with reference to FIGS. 10A and 10B may also be identically or similarly applicable to this embodiment, and thus the repetitive description will be omitted for brevity.

A first resist pattern 220 may be formed on a first interlayer dielectric layer 24 provided on the first substrate 10. The first resist pattern 220 may be formed on each of the unit semiconductor chip regions USCR. Accordingly, a portion of the first interlayer dielectric layer 24 may be exposed through a space between the first resist patterns 220 adjacent to each other.

Figure 22A:
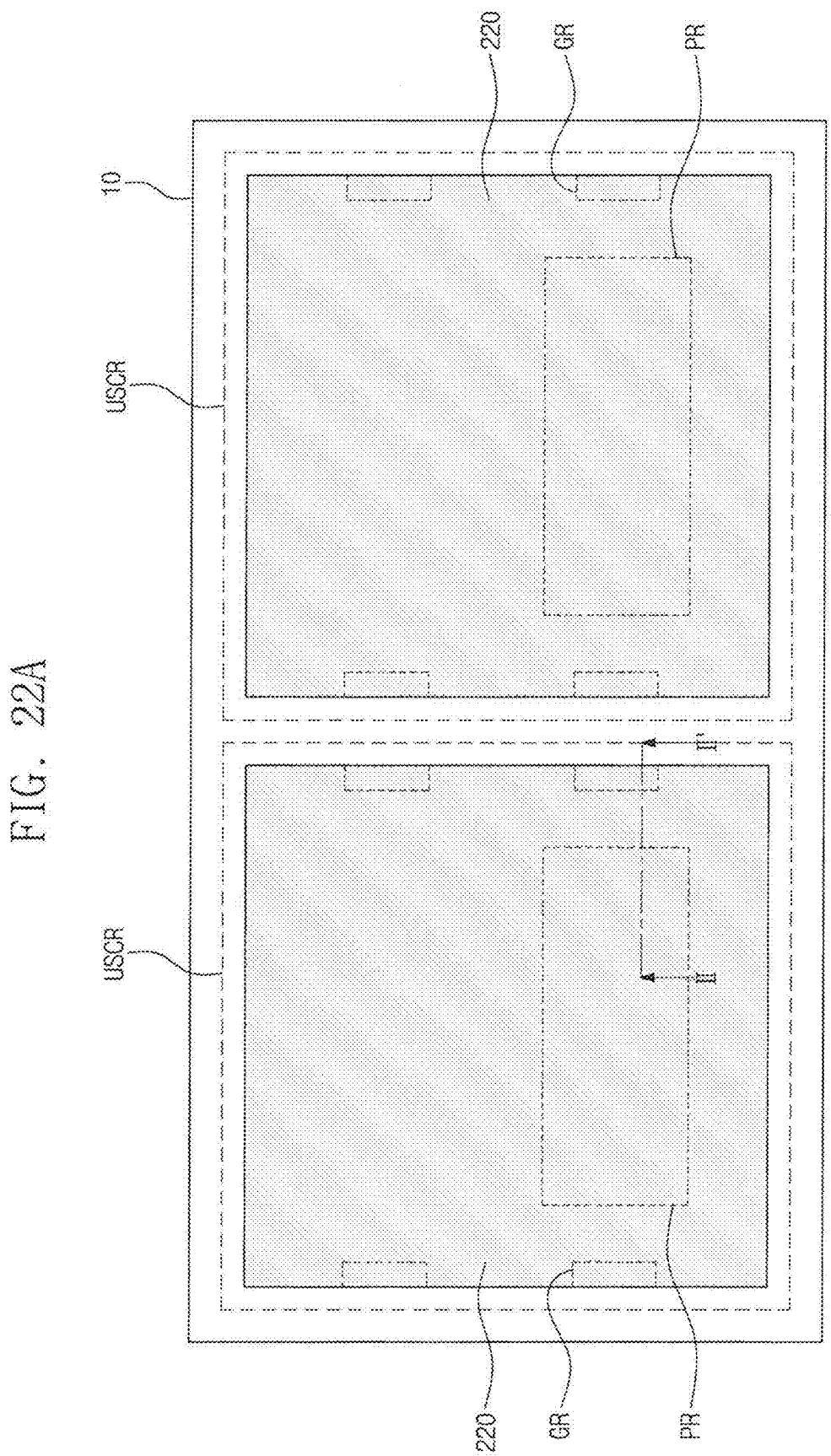
Figure 22B:
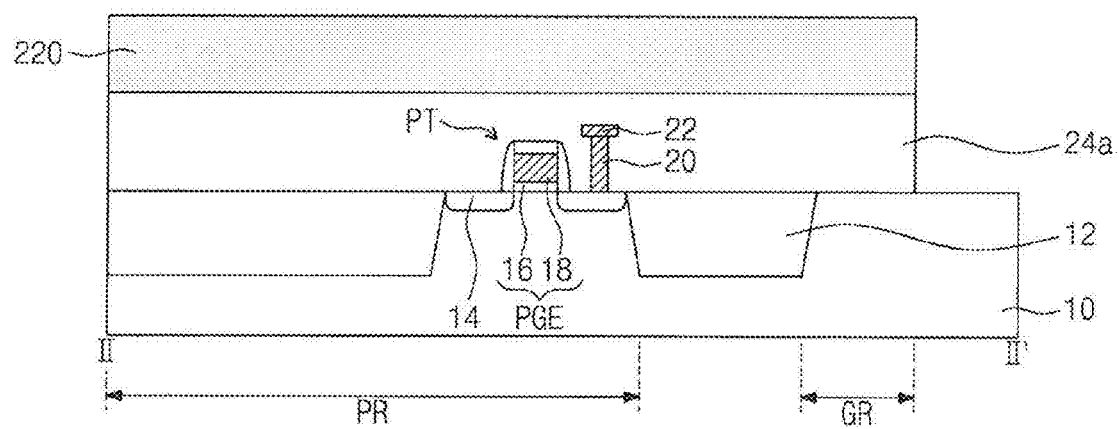

Referring to FIGS. 22A and 22B, the exposed portion of the first interlayer dielectric layer 24 may be etched to form a first interlayer dielectric pattern 24*a*. The first interlayer dielectric pattern 24*a* may be formed on each of the unit semiconductor chip regions USCR. A top surface of the first substrate 10 may be partially exposed through the etched portion of the first interlayer dielectric pattern 24*a*.

Figure 23A:
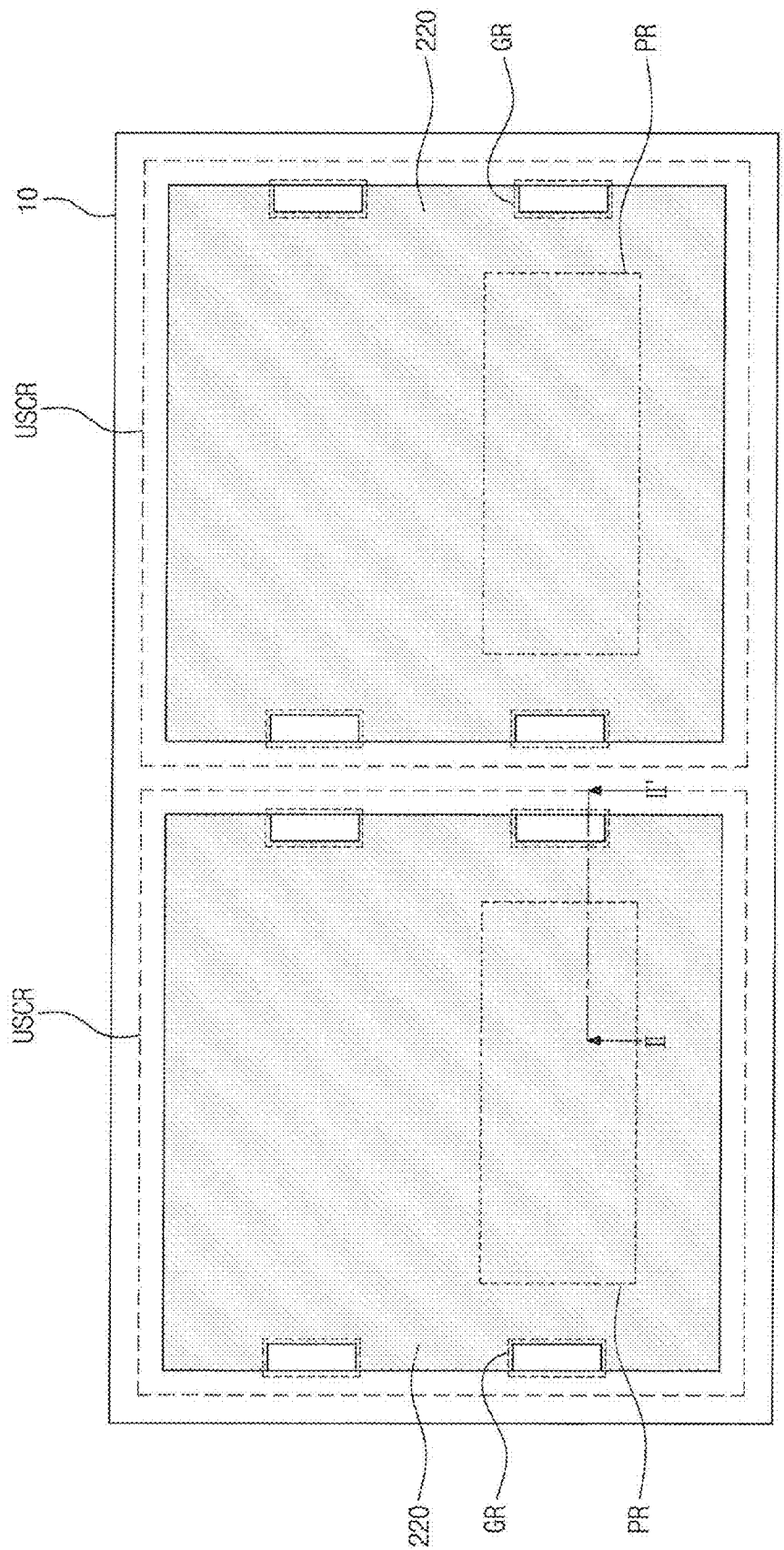
Figure 23B:
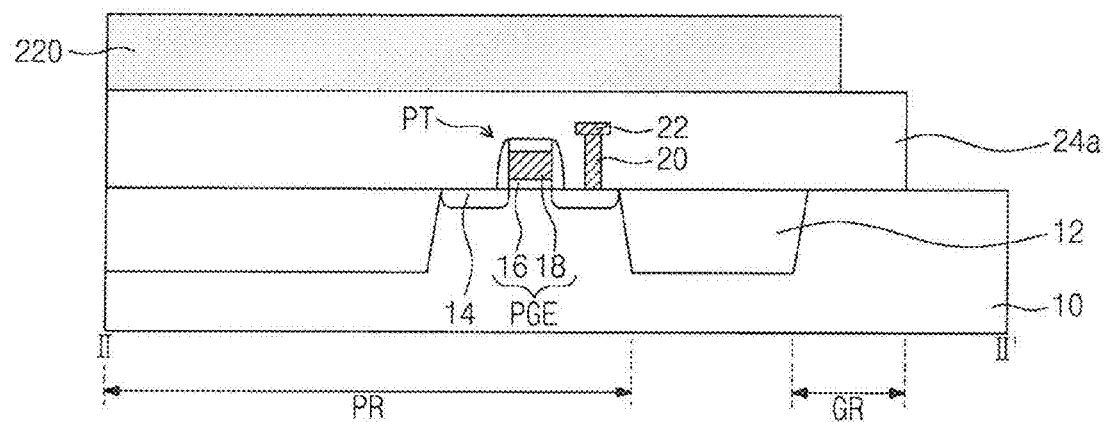

Referring to FIGS. 23A and 23B, an etch process may be performed to partially etch an edge of the first resist pattern 220. The first interlayer dielectric pattern 24*a* may then include a plurality of exposed edge portions that overlap the ground regions GR of the first substrate 10.

Figure 24A:
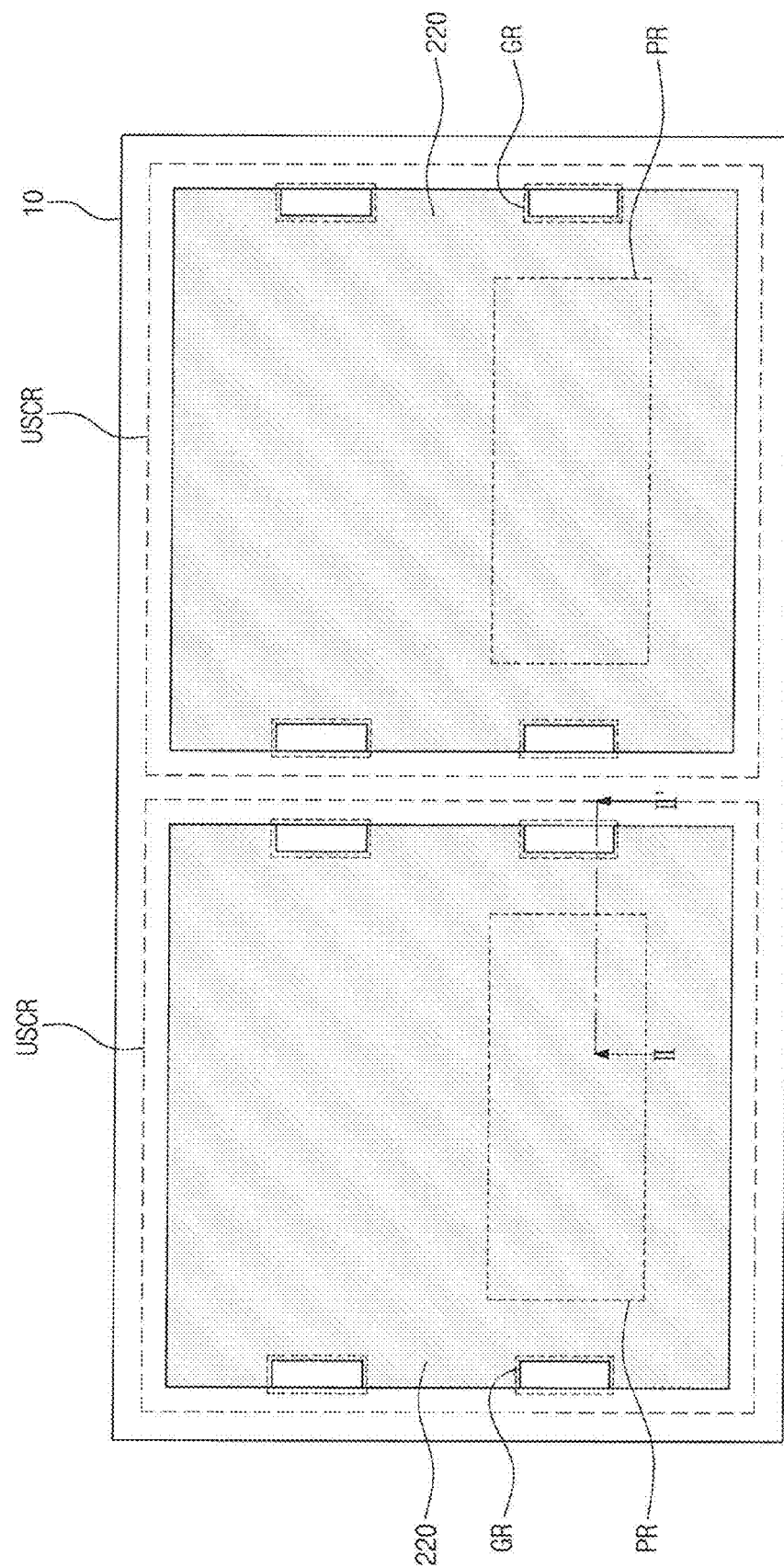
Figure 24B:
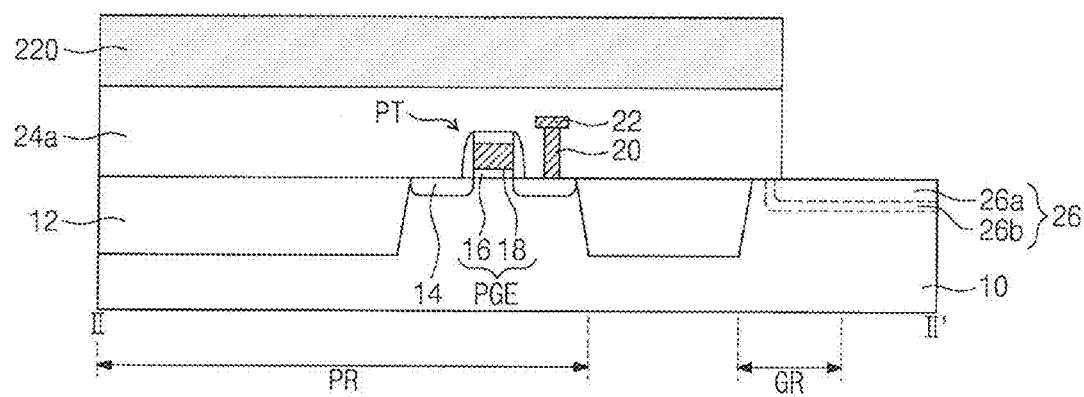

Referring to FIGS. 24A and 24B, an etch process may be performed to etch the exposed edge portions of the first interlayer dielectric pattern 24*a*. The ground regions GR of the first substrate 10 may then be exposed through the etched edge portions of the First interlayer dielectric pattern 24*a*.

An impurity region 26 may be formed in the ground region GR of the first substrate 10. The impurity region 26 may be formed in the first substrate 10 between the first interlayer dielectric patterns 24*a* adjacent to each other. The impurity region 26 may include a first impurity region 26*a* and a second impurity region 26*b* that envelops the first impurity region 26*a* and has an impurity concentration less than that of the first impurity region 26*a*.

The first resist pattern 220 may be removed after etching the exposed edge portions of the first interlayer dielectric pattern 24*a*. Alternatively, the first resist pattern 220 may be removed after forming the impurity region 26.

Figure 25A:
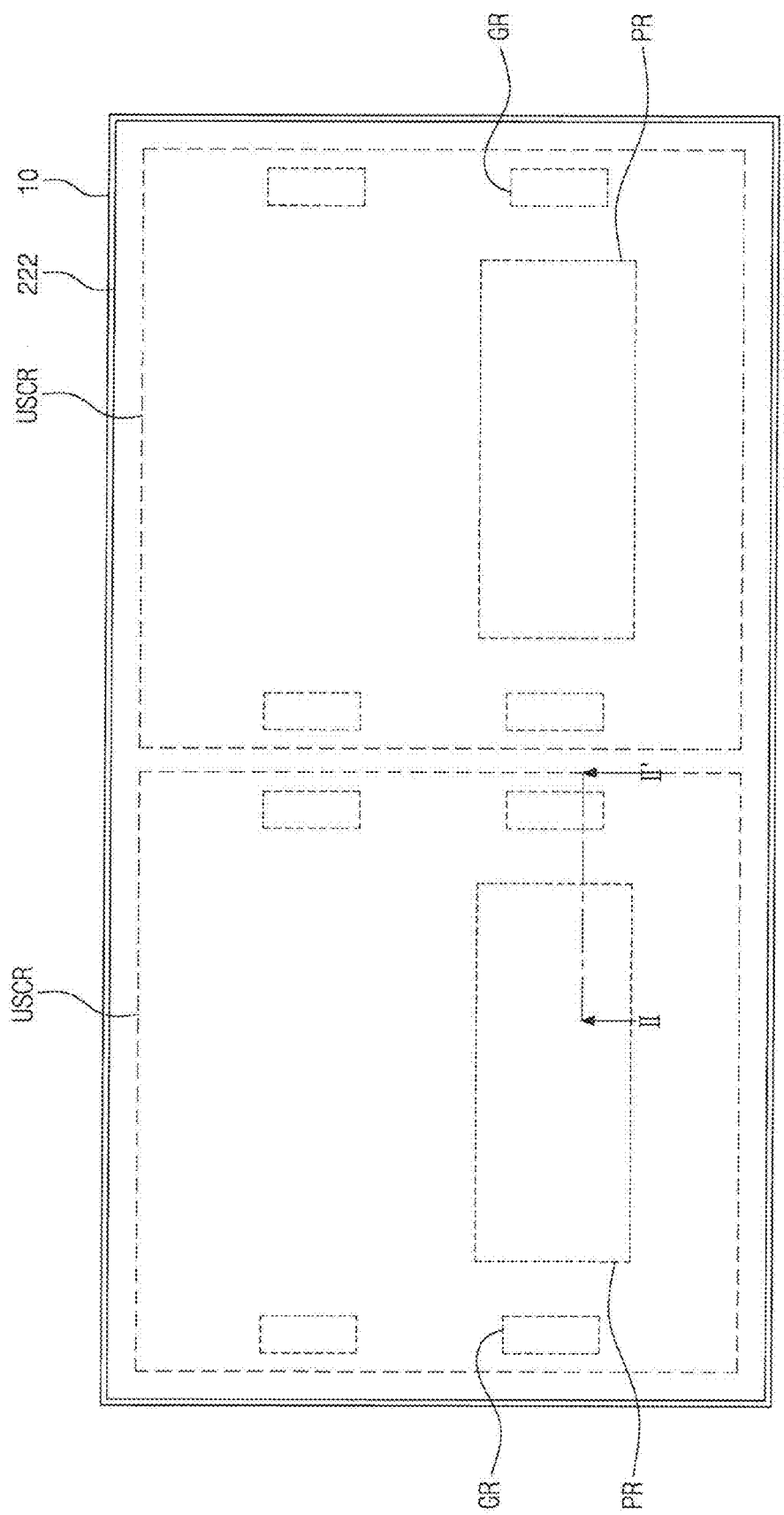
Figure 25B:
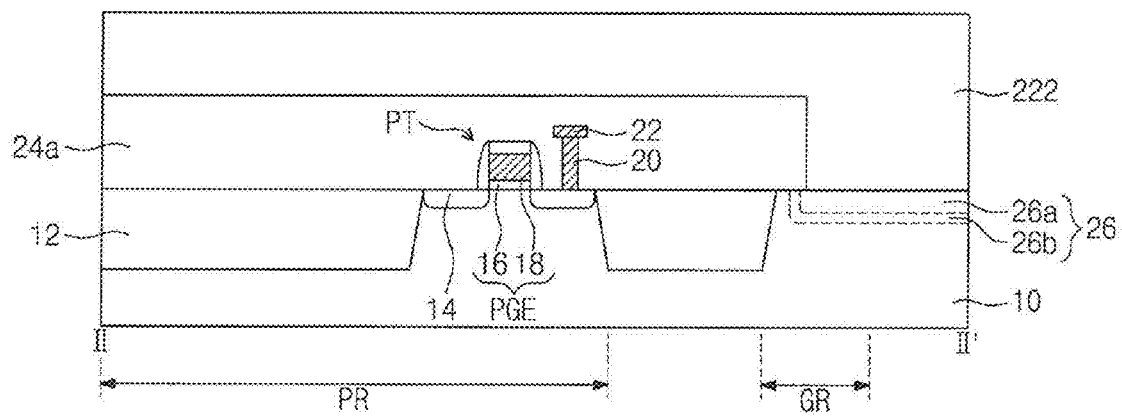

Referring to FIGS. 25A and 25B, a conductive layer 222 may be formed on the first substrate 10. The conductive layer 222 may cover the first interlayer dielectric pattern 24*a* and further cover a portion of the first substrate 10 exposed through the first interlayer dielectric pattern 24*a*.

Figure 26B:
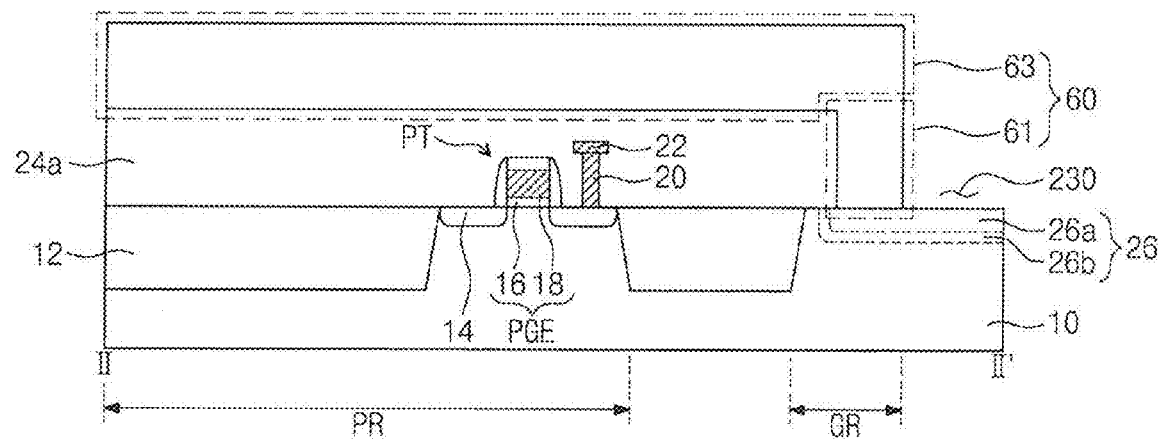

Referring to FIGS. 26A and 26B, the conductive layer 222 may be patterned to form a silicon structure 60 on the first substrate 10. The patterning of the conductive layer 222 may include etching a portion of the conductive layer 222 between the first interlayer dielectric patterns 24*a* adjacent to each other. The silicon structure 60 may be provided in plural, and the plurality of silicon structures 60 may be respectively disposed on the first interlayer dielectric patterns 24*a* and spaced apart from each other. After pattering the conductive layer 222, an etching region 230 may be formed between the silicon structures 60 adjacent to each other. The impurity region 26 may be partially exposed through the etching region 230.

The silicon structure 60 may include a silicon pattern 61 in contact with the impurity region 26 and a silicon layer 63 extending from the silicon pattern 61 onto a top surface of the first interlayer dielectric pattern 24*a*.

Figure 27A:
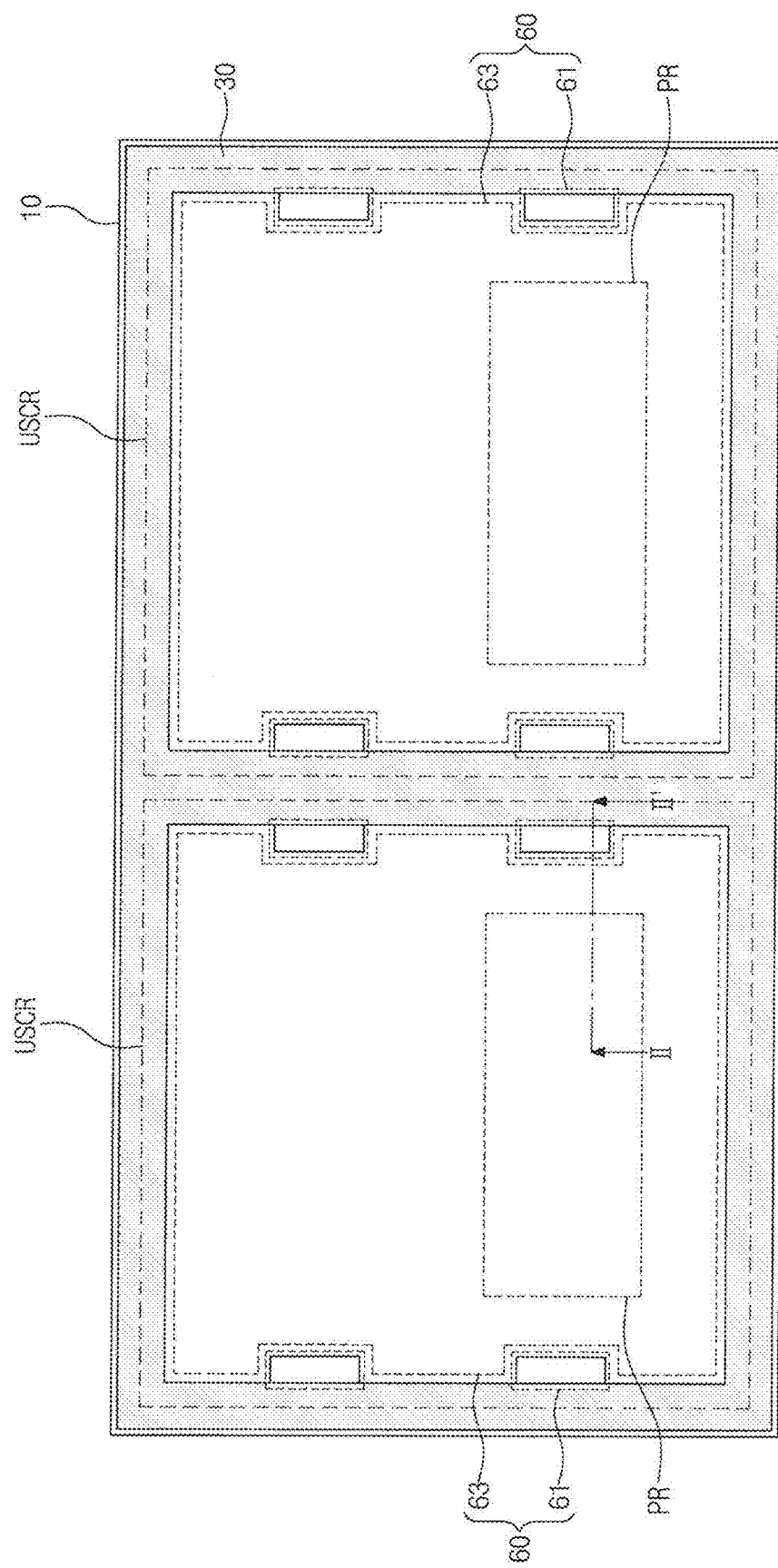
Figure 27B:
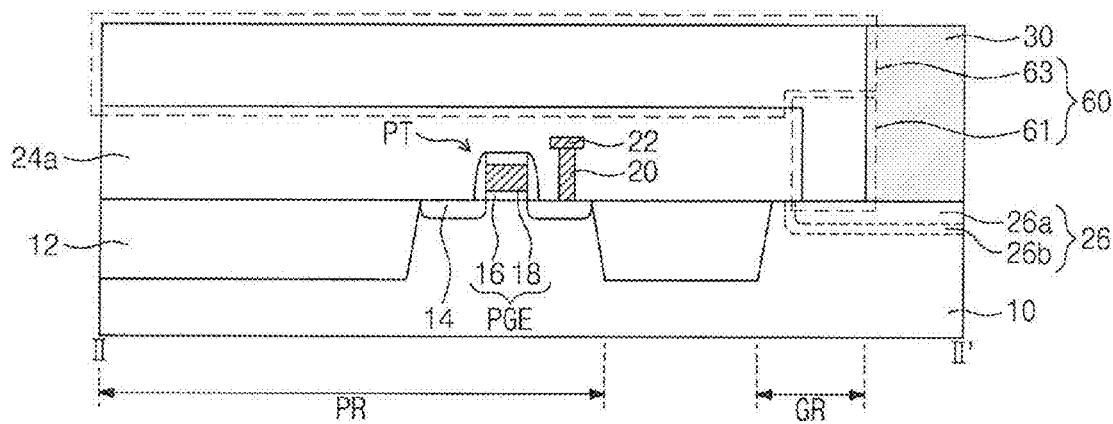

Referring to FIGS. 27A and 27B, an isolation pattern 30 may be formed in the etching region 230. The isolation pattern 30 may be formed by forming an insulation layer covering the silicon structure 60 and filling the etching region 230 and then planarizing the insulation layer until a top surface of the silicon structure 60 is exposed.

A detailed description of a cell array structure CAS formed on the silicon structure 60 may be substantially the same as that discussed with reference to FIGS. 16 and 20, and thus the repetitive description will be omitted.

According to the present embodiments, the via may electrically connect the second substrate to the first substrate in a ground state and thus it may be possible to reduce or prevent the mold structure from breakdown during the dry etch process.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A semiconductor memory device, comprising:
a peripheral circuit gate pattern on a first substrate;
a cell array structure on the peripheral circuit gate pattern;
a second substrate between the first substrate and the cell array structure; and
a via disposed between the first substrate and the second substrate and spaced apart from the peripheral circuit gate pattern,
wherein the via electrically connects the first and second substrates to each other.

2. The semiconductor memory device of claim 1, further comprising an impurity region in the first substrate and spaced apart from the peripheral circuit gate pattern,
wherein the impurity region has a conductivity different from that of the first substrate and receives an end of the via.

3. The semiconductor memory device of claim 2, wherein the impurity region comprises a first impurity region and a second impurity region enveloping the first impurity region,
wherein the first impurity region has an impurity concentration greater than that of the second impurity region.

4. The semiconductor memory device of claim 1, further comprising:
a source/drain region on a side of the peripheral circuit gate pattern in the first substrate; and
a contact plug that is in contact with the source/drain region and disposed between the first substrate and the second substrate,
wherein the via includes a top surface coplanar with a bottom surface of the second substrate, and
wherein the contact plug includes a top surface lower than the bottom surface of the second substrate relative to the first substrate.

5. The semiconductor memory device of claim 1, wherein
the first substrate comprises a peripheral circuit region and a ground region in the peripheral circuit region,
the second substrate comprises a cell array region vertically overlapping the peripheral circuit region, and
the via is disposed between the cell array region and the ground region.

6. The semiconductor memory device of claim 1, wherein
the first substrate comprises a peripheral circuit region disposed on a portion of a central part of the first substrate and a ground region disposed on a portion of a circumferential part of the first substrate,
the second substrate comprises a cell array region vertically overlapping the peripheral circuit region and a contact region vertically overlapping the ground region, and
the via is disposed between the contact region and the ground region.

7. The semiconductor memory device of claim 6, wherein
the via comprises a first sidewall and a second sidewall facing each other,
the second substrate comprises a first side surface and a second side surface facing each other,
wherein the second sidewall of the via is coplanar with the second side surface of the second substrate, and the first sidewall of the via is disposed between the first and second side surfaces of the second substrate.

8. The semiconductor memory device of claim 7, further comprising an isolation pattern that is in contact with the second sidewall of the via and wraps the second side surface of the second substrate,
wherein the isolation pattern has a thickness substantially equal to a sum of a thickness of the via and a thickness of the second substrate.

9. The semiconductor memory device of claim 1, further comprising an isolation pattern wrapping a side surface of the second substrate.

10. The semiconductor memory device of claim 9, wherein the first substrate has a planar area substantially equal to a sum of a planar area of the second substrate and a planar area of the isolation pattern.

11. The semiconductor memory device of claim 9, wherein the isolation pattern has a thickness greater than that of the second substrate.

12. The semiconductor memory device of claim 1, wherein the cell array structure comprises:
a stack structure including gate patterns that are stacked on the second substrate;
a vertical channel region penetrating the stack structure; and
a charge storage structure between the vertical channel region and each of the gate patterns.

* * * * *